(12) United States Patent
Moriyama et al.

(10) Patent No.: US 8,710,659 B2
(45) Date of Patent: Apr. 29, 2014

(54) SEMICONDUCTOR DEVICE AND METHOD OF MANUFACTURING THE SAME

(75) Inventors: Kei Moriyama, Kyoto (JP); Shuichi Tamaki, Kyoto (JP); Shuichi Sako, Kyoto (JP); Mitsuhide Kori, Kyoto (JP); Junji Goto, Kyoto (JP); Tatsuya Sawada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 322 days.

(21) Appl. No.: 13/006,965

(22) Filed: Jan. 14, 2011

(65) Prior Publication Data

US 2011/0186962 A1  Aug. 4, 2011

(30) Foreign Application Priority Data

Jan. 15, 2010 (JP) ................................. 2010-007094
Jan. 15, 2010 (JP) ................................. 2010-007095
Jan. 15, 2010 (JP) ................................. 2010-007096
Mar. 24, 2010 (JP) ................................. 2010-068051

(51) Int. Cl.
*H01L 23/532* (2006.01)

(52) U.S. Cl.
USPC .................. 257/751; 257/529; 257/E21.575; 257/E23.161; 257/E23.02

(58) Field of Classification Search
None
See application file for complete search history.

(56) References Cited

U.S. PATENT DOCUMENTS

| | | | |
|---|---|---|---|
| 6,451,681 B1 * | 9/2002 | Greer | 438/601 |
| 7,361,993 B2 * | 4/2008 | Coolbaugh et al. | 257/758 |
| 7,368,330 B2 * | 5/2008 | Song et al. | 438/128 |
| 2004/0207092 A1 * | 10/2004 | Burrell et al. | 257/758 |
| 2008/0237863 A1 * | 10/2008 | Toyoda et al. | 257/751 |
| 2010/0155582 A1 * | 6/2010 | Hirano et al. | 250/227.11 |
| 2010/0181650 A1 * | 7/2010 | Shigihara et al. | 257/620 |

FOREIGN PATENT DOCUMENTS

| | | |
|---|---|---|
| JP | 8-167634 A | 6/1996 |
| JP | 2005-166900 A | 6/2005 |

\* cited by examiner

*Primary Examiner* — Calvin Lee
*Assistant Examiner* — Abul Kalam
(74) *Attorney, Agent, or Firm* — Rabin & Berdo, P.C.

(57) ABSTRACT

A semiconductor device includes an interlayer dielectric film, a passivation film, made of an insulating material, formed on the interlayer dielectric film, an uppermost wire, made of a material mainly composed of copper, formed between the surface of the interlayer dielectric film and the passivation film, and a wire covering film, made of a material mainly composed of aluminum, interposed between the passivation film and the surface of the uppermost wire for covering the surface of the uppermost wire.

50 Claims, 28 Drawing Sheets

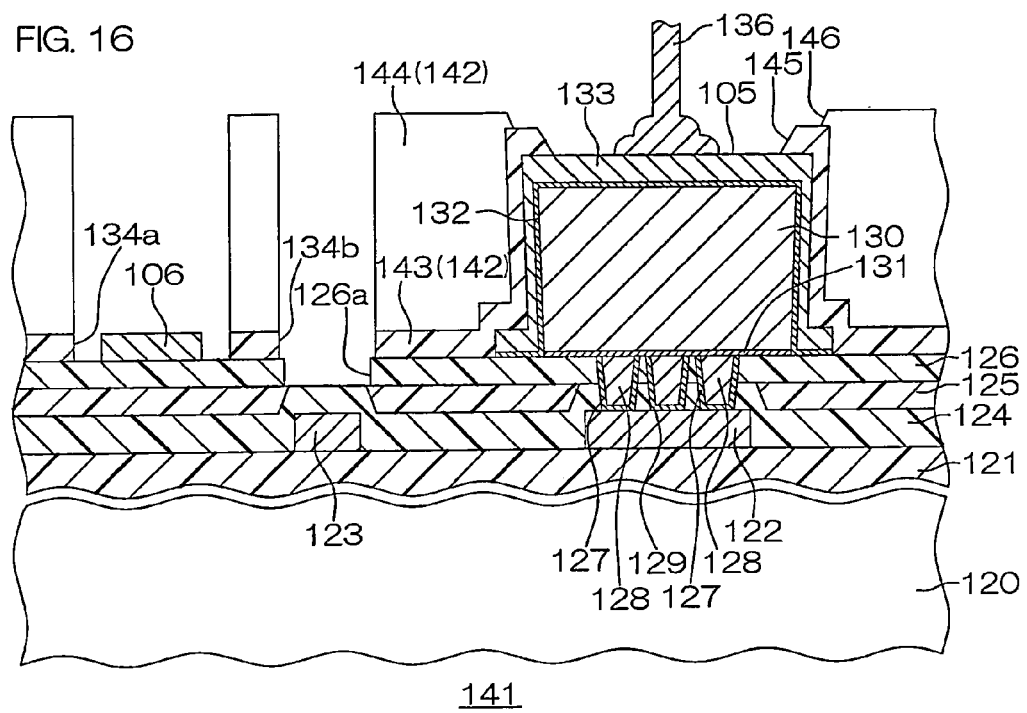
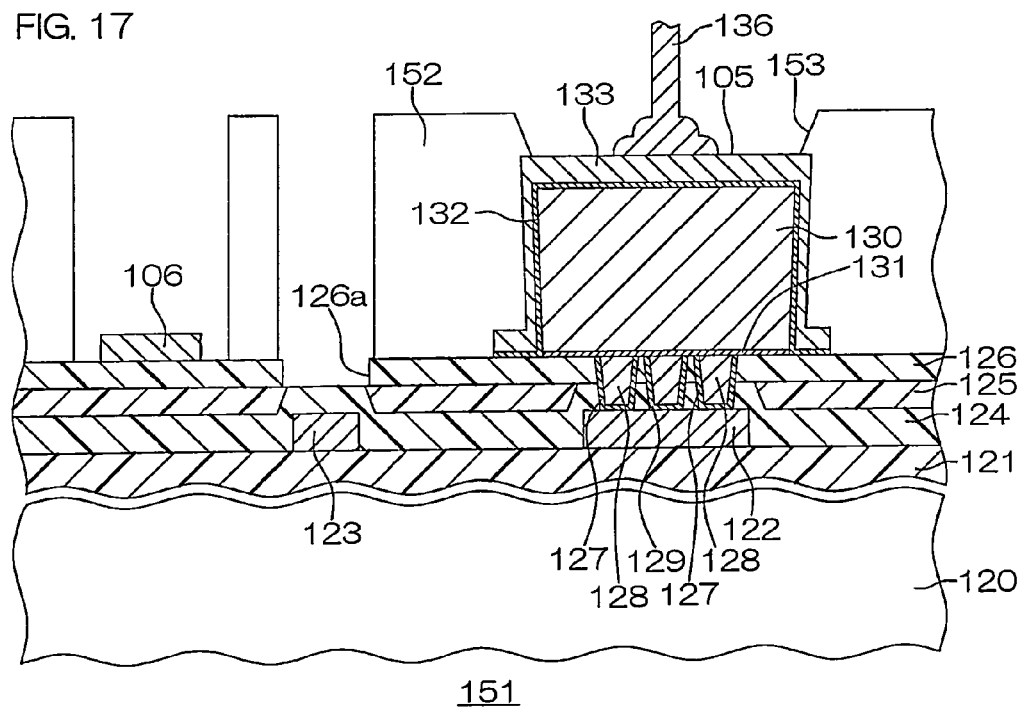

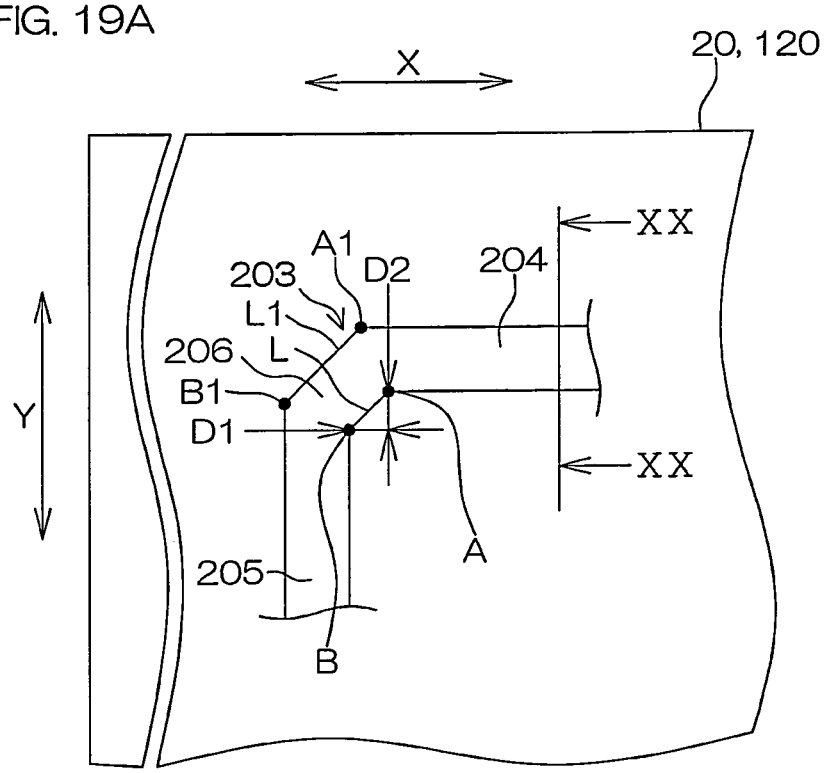

CORNER 90°
WIDTH OF WIRE 10 μm

CORNER 90°
WIDTH OF WIRE 50 μm

SEMICONDUCTOR DEVICE AND METHOD OF MANUFACTURING THE SAME

BACKGROUND OF THE INVENTION

1. Field of the Invention

The present invention relates to a semiconductor device having a multilayer interconnection structure and a method of manufacturing the same.

2. Description of Related Art

A semiconductor device has a multilayer interconnection structure on a semiconductor substrate.

Al (aluminum) is widely employed as the material for wires. In a multilayer interconnection structure employing Al as the material for wires, interlayer dielectric films having planar surfaces and wires arranged on the planar surfaces of the interlayer dielectric films are alternately stacked. A passivation film made of SiN (silicon nitride) is formed on the uppermost interlayer dielectric film, and the wire (the uppermost wire) arranged on the interlayer dielectric film is covered with the passivation film.

SUMMARY OF THE INVENTION

A first object of the present invention is to provide a semiconductor device capable of preventing a passivation film from separating from an uppermost wire made of a material mainly composed of Cu.

A second object of the present invention is to provide a semiconductor device and a method of manufacturing the same, each allowing accurate recognition of the position of an alignment mark in a structure having an uppermost wire made of Cu.

A third object of the present invention is to provide a semiconductor device capable of electrically connecting an uppermost wire and a lower wire made of Cu while excellently preventing diffusion of Cu into an interlayer dielectric film.

A fourth object of the present invention is to provide a semiconductor device capable of preventing cracking resulting from concentration of stress on a passivation film.

The foregoing and other objects, features and effects of the present invention will become more apparent from the following detailed description of the embodiments with reference to the attached drawings.

BRIEF DESCRIPTION OF THE DRAWINGS

FIG. 16 is a schematic sectional view showing a first modification of the semiconductor device shown in FIG. 13.

FIG. 17 is a schematic sectional view showing a second modification of the semiconductor device shown in FIG. 13.

FIG. 19A is an illustrative plan view showing a wire in a portion XIXA in FIG. 19 in an enlarged manner.

DETAILED DESCRIPTION OF PREFERRED EMBODIMENTS

Figure 1:
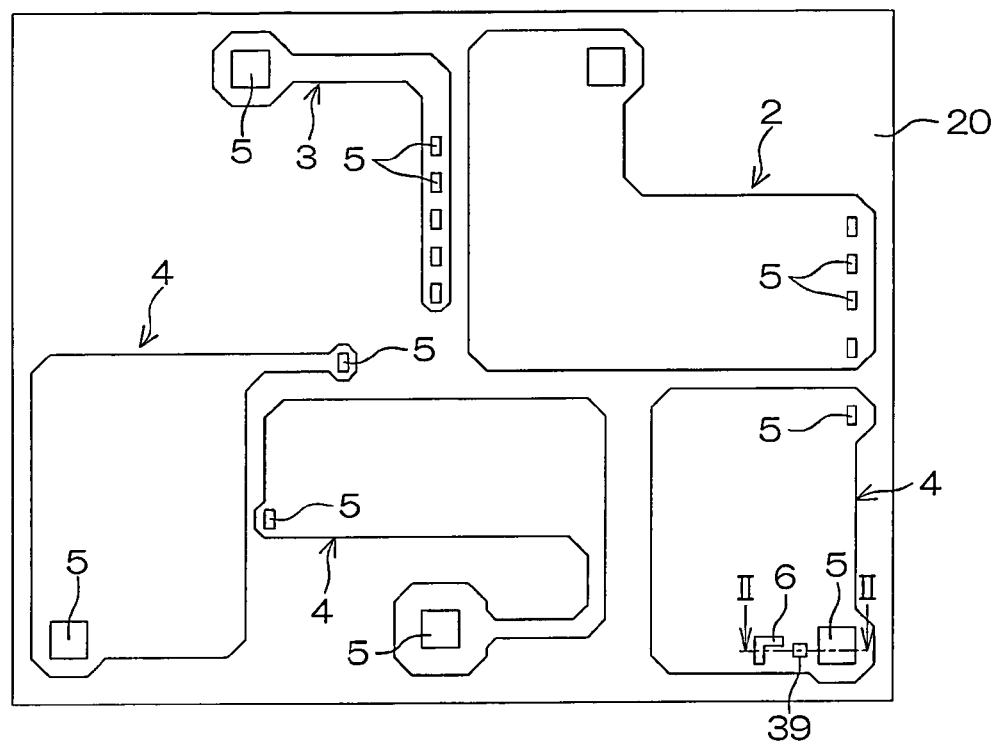
FIG. 1 is an illustrative plan view of a semiconductor device according to a first embodiment of the present invention.

In recent years, reduction of wire resistance has been desired particularly in a power semiconductor device consuming high power. Therefore, the inventors consider employment of Cu (copper) having higher conductivity than Al as the material for an uppermost wire.

Cu, having high conductivity, is an element inferior in adhesiveness to an insulating material such as SiN, and easily ionized. If Cu is employed as the material for the uppermost wire, therefore, a passivation film may separate from the uppermost wire such that Cu ions diffuse from the uppermost wire along the interface between the uppermost wire and the passivation film, to form a leakage path between the uppermost wire and another uppermost wire.

Accordingly, an embodiment according to a first aspect of the present invention provides a semiconductor device including an interlayer dielectric film, a passivation film, made of an insulating material, formed on the interlayer dielectric film, an uppermost wire, made of a material mainly composed of copper, formed between the surface of the interlayer dielectric film and the passivation film, and a wire covering film, made of a material mainly composed of aluminum, interposed between the passivation film and the surface of the uppermost wire for covering the surface of the uppermost wire.

In the semiconductor device, the uppermost wire made of the material mainly composed of copper is formed on the interlayer dielectric film. The surface of the uppermost wire is covered with the wire covering film made of the material mainly composed of aluminum. The passivation film is formed on the interlayer dielectric film, and the uppermost wire whose surface is covered with the wire covering film is covered with the passivation film on the outer side of the wire covering film.

Aluminum employed as the main component of the wire covering film has high adhesiveness to copper employed as the main component of the uppermost wire. Therefore, the wire covering film excellently adheres to the surface of the uppermost wire. Further, aluminum employed as the main component of the wire covering film has high adhesiveness to the insulating material forming the passivation film. Therefore, the passivation film excellently adheres to the surface of the wire covering film. Thus, the passivation film can be prevented from separating from the uppermost wire.

The uppermost wire is covered with the wire covering film made of aluminum. When an opening (a pad opening) is formed in the passivation film to partially expose the wire covering film through the opening, therefore, a bonding wire can be directly bonded to the exposed portion of the wire covering film. Therefore, no bonding pad may be provided on the uppermost wire, whereby neither a step of forming a bonding pad nor a layer used for the step is necessary.

If the bonding wire is made of gold, a barrier film having a barrier property against diffusion of gold is preferably interposed between the wire covering film and the uppermost wire. Thus, the gold forming the bonding wire can be prevented from diffusing into the uppermost wire through the wire covering film.

The barrier film preferably has a barrier property against diffusion of copper. Thus, copper (copper ions) can be prevented from diffusing from the uppermost wire, whereby formation of a leakage path between the uppermost wire and another uppermost wire can be reliably prevented.

If the bonding wire is made of copper, no barrier film may be interposed between the wire covering film and the uppermost wire, and the wire covering film may be in close contact with the uppermost wire.

The wire covering film can be formed by forming a metal film to collectively cover the surfaces of the interlayer dielectric film and the uppermost wire after the formation of the uppermost wire and removing an unnecessary portion of the metal film located on the interlayer dielectric film. At this time, dry etching such as RIE (Reactive Ion Etching) executable at a lower cost than wet etching can be employed as the technique for removing the unnecessary portion of the metal film. Thus, the manufacturing cost for the semiconductor device can be reduced.

The material for the passivation film may be silicon nitride, or an organic material. The passivation film may include a nitride film made of silicon nitride and an organic film, made of an organic material, formed on the nitride film.

The interlayer dielectric film may be made of silicon nitride.

The inventors have studied about forming the uppermost wire made of Cu with a larger thickness than a conventional uppermost wire made of Al in the case of employing Cu (copper) having higher conductivity than Al as the material for the uppermost wire.

In this case, an alignment mark formed in the same step as the uppermost wire is made of Cu identical to the material for the uppermost wire, and has the same thickness as the uppermost wire. Cu has lower light reflectance than Al. Therefore, the recognition accuracy for the position (X- and Y-positions) of the alignment mark made of Cu is lower than that for the position of an alignment mark made of Al. Further, the distance between the surfaces of the alignment mark and a fuse is increased, due to the large thickness of the alignment mark. Consequently, the recognition accuracy for the position (X-, Y- and Z-positions) of the fuse is reduced, to remarkably reduce the accuracy in working for cutting the fuse.

Accordingly, an embodiment according to a second aspect of the present invention provides a semiconductor device including an interlayer dielectric film, an uppermost wire, made of a material mainly composed of Cu, formed on the surface of the interlayer dielectric film, a wire covering film, made of a material mainly composed of Al, formed on the uppermost wire, an alignment mark, made of the same material as the wire covering film, formed on the surface of the interlayer dielectric film, and a passivation film, made of an insulating material, covering the surfaces of the interlayer dielectric film and the wire covering film and provided with an opening exposing the alignment mark.

The semiconductor device can be manufactured by a manufacturing method including the following steps A and B, for example:

A: a wire forming step of forming an uppermost wire made of a material mainly composed of Cu on the surface of an interlayer dielectric film, and B: a step of forming an alignment mark on the interlayer dielectric film while forming a wire covering film on the uppermost wire by forming a metal film made of a material mainly composed of Al on the interlayer dielectric film and the uppermost wire and by patterning the metal film after the wire forming step.

The alignment mark is made of the material mainly composed of Al having higher light reflectance than copper. Therefore, the recognition accuracy for the position (X- and Y-positions) of the alignment mark can be increased. In the structure having the uppermost wire mainly composed of Cu, therefore, the position of the alignment mark can be accurately recognized.

The alignment mark is formed not on the uppermost wire, but on the surface of the interlayer dielectric film. If a fuse for adjusting the characteristic values of a circuit provided on the semiconductor device is formed under the interlayer dielectric film, therefore, the distance between the alignment mark and the fuse can be reduced, as compared with a structure having an alignment mark formed on an uppermost wire. Therefore, the position (X-, Y- and Z-positions) of the fuse can be accurately recognized, to improve accuracy in working for cutting the fuse.

The wire covering film may cover the surface of the uppermost wire. Al employed as the main component of the wire covering film has high adhesiveness to Cu employed as the main component of the uppermost wire. Therefore, the wire covering film excellently adheres to the surface of the uppermost wire. Further, Al employed as the main component of the wire covering film has high adhesiveness to the insulating material forming the passivation film. Therefore, the passivation film excellently adheres to the surface of the wire covering film. Thus, the passivation film can be prevented from separating from the uppermost wire.

The uppermost wire is covered with the wire covering film made of Al. When an opening (a pad opening) is formed in the passivation film to partially expose the wire covering film through the opening, therefore, a bonding wire can be directly bonded to the exposed portion of the wire covering film. Therefore, no bonding pad may be provided on the uppermost wire, whereby neither a step of forming a bonding pad nor a layer used for the step is necessary.

If the bonding wire is made of Au (gold), a barrier film having a barrier property against diffusion of Au is preferably interposed between the wire covering film and the uppermost wire. Thus, Au forming the bonding wire can be prevented from diffusing into the uppermost wire through the wire covering film.

The barrier film preferably has a barrier property against diffusion of Cu. Thus, Cu (Cu ions) can be prevented from diffusing from the uppermost wire, whereby formation of a leakage path between the uppermost wire and another uppermost wire can be reliably prevented.

If the bonding wire is made of Cu, no barrier film may be interposed between the wire covering film and the uppermost wire, and the wire covering film may be in close contact with the uppermost wire.

The wire covering film can be formed by forming a metal film to collectively cover the surfaces of the interlayer dielectric film and the uppermost wire after the formation of the uppermost wire and removing an unnecessary portion of the metal film located on the interlayer dielectric film. At this time, dry etching such as RIE (Reactive Ion Etching) executable at a lower cost than wet etching can be employed as the technique for removing the unnecessary portion of the metal film. Thus, the manufacturing cost for the semiconductor device can be reduced.

The material for the passivation film may be silicon nitride, or an organic material. The passivation film may include a nitride film made of silicon nitride and an organic film, made of an organic material, formed on the nitride film.

The material for the interlayer dielectric film may be silicon nitride.

The inventors have studied a via for electrically connecting the uppermost wire and a wire (a lower wire) formed under the uppermost wire with each other. If Cu is employed as the material for the uppermost wire, the via for electrically connecting the uppermost wire and the lower wire with each other is integrally formed with the uppermost wire in general.

More specifically, the lower wire is partially exposed after the interlayer dielectric film is formed on the lower wire, an opening is formed to pass through the interlayer dielectric film, and Cu is grown by plating on the interlayer dielectric film including the opening, whereby the via filling up the opening and the uppermost wire are collectively formed.

If the via made of Cu and the interlayer dielectric film are in contact with each other, Cu ions contained in the via may diffuse into the interlayer dielectric film, to form a leakage path. Therefore, a barrier film having a barrier property against diffusion of Cu must be interposed between the via and the interlayer dielectric film.

The opening is formed in a relatively large size in plan view (in the form of a rectangle having sides of 5 to 6 µm each in plan view, for example). Thus, the sectional area of the via formed in the opening is increased, whereby connection resistance between the uppermost wire and the lower wire can be reduced. However, the size of the bottom surface of the opening is so large that, when a barrier film having the necessary and sufficient thickness is formed on the bottom surface in order to ensure the barrier property against diffusion of Cu, the thickness of the barrier film is reduced on the side surface of the opening (the surface of the interlayer dielectric film facing the opening) and a corner portion formed by the bottom surface and the side surface of the opening. Therefore, Cu ions may diffuse into the interlayer dielectric film from the thin portion of the barrier film.

Accordingly, an embodiment according to a third aspect of the present invention provides a semiconductor device including a lower wire, an interlayer dielectric film formed on the lower wire, an uppermost wire, made of a material mainly composed of Cu, protruding on the surface of the interlayer dielectric film, and a plurality of vias passing through the interlayer dielectric film in the thickness direction for electrically connecting the lower wire and the uppermost wire with each other.

The uppermost wire and the lower wire are electrically connected with each other by the plurality of vias, whereby the size of each via can be reduced without increasing connection resistance between the uppermost wire and the lower wire, as compared with a structure in which the uppermost wire and the lower wire are connected with each other by only one via. When the size of the vias is reduced, the size of openings (via holes) formed in the interlayer dielectric film for embedding the vias therein is reduced accordingly.

If the vias are made of a metallic material containing Cu and a barrier film for preventing diffusion of Cu is interposed between the vias and the interlayer dielectric film, therefore, the barrier film can be formed on the bottom surfaces and the side surfaces of the openings, including corner portions formed by the bottom surfaces and the side surfaces, for embedding the vias therein with a generally uniform thickness.

If the vias are made of a conductive material (W (tungsten), for example) not containing Cu, no Cu diffuses from the vias into the interlayer dielectric film, and hence no barrier film may be provided between the vias and the interlayer dielectric film.

In each case, therefore, the uppermost wire mainly composed of Cu and the lower wire can be electrically connected with each other while excellently preventing diffusion of Cu into the interlayer dielectric film.

The vias of such a reduced size can be formed in the same step as vias in other portions of the semiconductor device. Thus, the steps of manufacturing the semiconductor device can be simplified.

If the vias are made of the conductive material not containing Cu, no barrier film may be provided between the vias and the interlayer dielectric film, whereby the step of forming the barrier film can be omitted. Thus, the steps of manufacturing the semiconductor device can be further simplified.

The surfaces of the vias and the surface of the interlayer dielectric film are preferably flush with one another. Thus, when a barrier film for preventing diffusion of Cu is formed between the uppermost wire and the interlayer dielectric film and the vias, the barrier film can be formed with a constant thickness. Therefore, the barrier film is not partially reduced in thickness, but can effectively prevent diffusion of Cu from the uppermost wire into the interlayer dielectric film.

The area proportion (hereinafter referred to simply as "via proportion") of a region provided with the vias with respect to the opposed area of the lower wire and the uppermost wire is preferably not less than 0.5% and not more than 30%.

When a current flows between the lower wire and the uppermost wire, a voltage drop is caused in accordance with the resistance of the vias. The resistance of the vias is reduced as the via proportion is increased, and hence the value of the voltage drop in the vias is also reduced. If the via proportion is not less than 0.5%, the voltage drop resulting from the current flowing in the vias can be reduced to not more than the allowance (300 mΩ in terms of the resistance, for example).

If the plurality of vias are arranged to be adjacent to one another, not less than a constant interval has to be provided between each pair of the adjacent vias. In order to ensure the interval between the vias, the via proportion is preferably not more than 30%. In this case, a mask pattern for forming the via holes for embedding the vias therein can be accurately formed.

An embodiment according to a fourth aspect of the present invention provides a semiconductor device including a lower wire, an interlayer dielectric film formed on the lower wire, an uppermost wire, made of a material mainly composed of Cu, protruding on the surface of the interlayer dielectric film, and a via, made of W, passing through the interlayer dielectric film in the thickness direction for electrically connecting the lower wire and the uppermost wire with each other.

In the semiconductor device, the interlayer dielectric film is formed on the lower wire. The uppermost wire made of the material mainly composed of Cu is formed on the surface of the interlayer dielectric film. The uppermost wire and the lower wire are electrically connected with each other by the via, made of W, passing through the interlayer dielectric film in the thickness direction.

The via is made of W, whereby no barrier film for preventing diffusion of Cu may be interposed between the via and the interlayer dielectric film, dissimilarly to a structure in which an uppermost wire and a via are integrally made of a material mainly composed of Cu. Therefore, diffusion of Cu into the interlayer dielectric film can be reliably prevented without forming a barrier film in a via hole.

The inventors have further studied a passivation film in a semiconductor device having wires made of a material mainly composed of copper.

The passivation film is formed by CVD (Chemical Vapor Deposition), for example. According to CVD, SiN employed as the material for the passivation film is deposited on the surface of an interlayer dielectric film and the surface of an uppermost wire in a state exposing the semiconductor device to a temperature condition of 400° C., for example, and the semiconductor device is thereafter naturally cooled to ordinary temperature. At this time, stress is applied to the passivation film, due to thermal expansion in the film formation and thermal contraction in the cooling.

The uppermost wire is formed in a prescribed wire pattern. On a corner portion where the wire is bent at a right angle, for example, stress is concentrated on a portion of the passivation film formed on the inner side surface thereof, to disadvantageously crack the passivation film.

Accordingly, an embodiment according to a fifth aspect of the present invention provides a semiconductor device including an interlayer dielectric film, a wire, made of a material mainly composed of copper, protruding from the surface of the interlayer dielectric film, and a passivation film, made of an insulating material, covering the surfaces of the interlayer dielectric film and the wire. In the semiconductor device, the wire has a first wire portion extending in a first direction, a second wire portion extending in a second direction orthogonal to the first direction, and one or a plurality of connecting wire portions, connecting an end portion of the first wire portion and an end portion of the second wire portion with each other, extending on a straight line intersecting with the first direction and the second direction respectively. The dimensions of a straight line, connecting a junction between the first wire portion and the connecting wire portion (s) and a junction between the second wire portion and the connecting wire portion(s) with each other, in the first direction and the second direction are not less than 1 µm respectively.

The connecting wire portion (s) is provided between the first wire portion and the second wire portion, whereby at least two corner portions are formed on the side surfaces of the wire, between the first wire portion and the connecting wire portion(s) and between the second wire portion and the connecting wire portion(s). If stress is applied to the passivation film covering the surface of the wire, therefore, the stress can be dispersed into the plurality of corner portions, whereby stress concentration on the passivation film can be suppressed.

Particularly when the wire has a width of not less than 10 µm, the stress applied to the passivation film is increased, to increase the probability of cracking of the passivation film. Also in this case, stress concentration on the passivation film can be suppressed by setting the dimensions of the straight line, connecting the junction between the first wire portion and the connecting wire portion (s) and the junction between the second wire portion and the connecting wire portion (s) with each other, in the first direction and the second direction to not less than 1 µm respectively, and cracking resulting from concentration of the stress on the passivation film can be prevented.

The uppermost wire may have only one of the connecting wire portion. Also when the uppermost wire has only one of the connecting portion, two corner portions are formed on the side surface of the wire. Thus, stress applied to portions of the passivation film covering the corner portions can be reduced, as compared with a structure in which the first wire portion and the second wire portion are directly connected with each other.

The semiconductor device preferably further includes a wire covering film, made of a material mainly composed of aluminum, interposed between the wire and the passivation film. Aluminum employed as the main component of the wire covering film has high adhesiveness to copper employed as the main component of the wire. Therefore, the wire covering film excellently adheres to the surface of the wire. Further, aluminum employed as the main component of the wire covering film has high adhesiveness to the insulating material forming the passivation film. Therefore, the passivation film excellently adheres to the surface of the wire covering film. Thus, the passivation film can be prevented from separating from the wire.

In this case, the semiconductor device preferably further includes a first barrier film, made of a material having a barrier property against diffusion of copper, interposed between the wire and the wire covering film. Thus, copper (copper ions) can be prevented from diffusing from the wire, whereby formation of a leakage path between the wire and another wire can be reliably prevented.

The semiconductor device preferably further includes a second barrier film, made of a material having a barrier property against diffusion of copper, interposed between the wire and the interlayer dielectric film. Thus, copper (copper ions) can be prevented from diffusing from the wire.

Each of the first barrier film and the second barrier film may be formed by a single film or a multilayer film made of not less than one material selected from a group consisting of Ti, TiN, WN, TaN, Ta, W and TiW.

Embodiments of the present invention are now described in detail with reference to the attached drawings.

FIG. 1 is an illustrative plan view showing a semiconductor device according to a first embodiment of the present invention.

A semiconductor device 1 is provided with an analog circuit 2, a digital circuit 3 and three power transistor circuits 4. More specifically, the analog circuit 2 and the digital circuit 3 are horizontally arranged on the upper half region while the three power transistor circuits 4 are horizontally arranged on the lower half region in the plan view shown in FIG. 1.

In the regions provided with the circuits 2 to 4, a plurality of pad electrodes 5 for electrically connecting the circuits 2 to 4 with an external device are arranged on proper positions.

An alignment mark 6 L-shaped in plan view is arranged on the region provided with the right power transistor 4 in FIG. 1.

The position (a θ-position) of the semiconductor device 1 around an axis orthogonal to the surface of the semiconductor device 1 can be detected by scanning the surface of the semiconductor device 1 with a laser beam and recognizing the alignment mark 6, for example. Further, the positions (X-, Y- and Z-positions) of the respective portions of the semiconductor device 1 can be detected on the basis of the position of the alignment mark 6.

Figure 2:
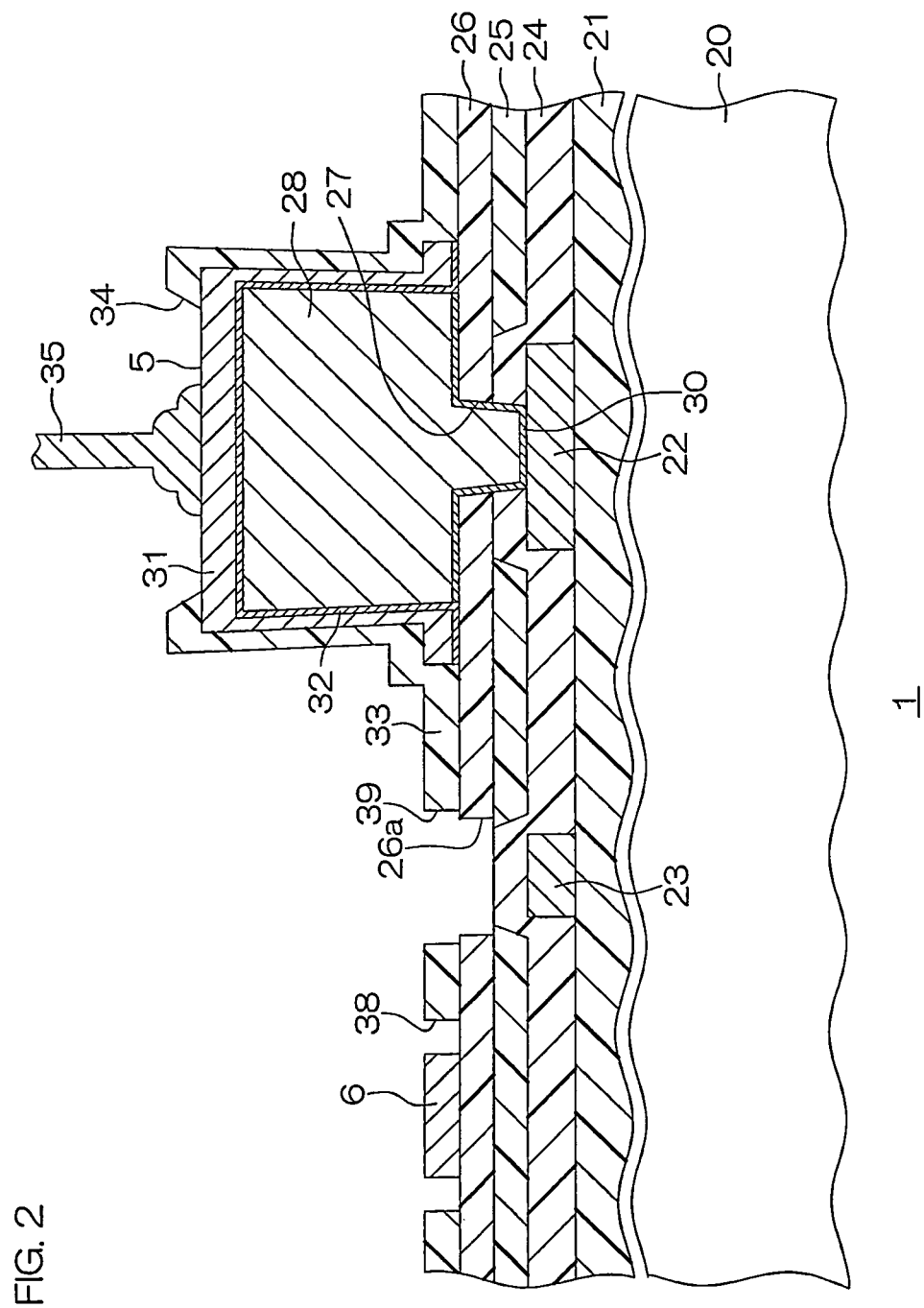
FIG. 2 is a sectional view of the semiconductor device taken along a line II-II in FIG. 1.

FIG. 2 is a sectional view of the semiconductor device 1 taken along a line II-II in FIG. 1.

As shown in FIG. 2, the semiconductor device 1 includes a substrate 20 made of Si (silicon) as the base thereof. A first interlayer dielectric film 21 is stacked on the substrate 20. The first interlayer dielectric film 21 is made of $SiO_2$ (silicon oxide).

A lower wire 22 and a fuse 23 are formed on the first interlayer dielectric film 21 at an interval from each other. The lower wire 22 and the fuse 23 are made of Al.

When the surface of the semiconductor device 1 is scanned with a laser beam and the position of the alignment mark 6 is recognized, the position (X-, Y- and Z-positions) of the fuse 23 is recognized on the basis of the position of the alignment mark 6. The fuse 23 can be individually cut by applying a laser beam to the recognized fuse 23. The characteristic values (the resistance etc., for example) of the power transistor circuits 4 (see FIG. 1) can be adjusted by whether or not cutting the fuse 23.

A second interlayer dielectric film 24 is stacked on the first interlayer dielectric film 21, the lower wire 22 and the fuse 23. The second interlayer dielectric film 24 is made of $SiO_2$. On the surface of the second interlayer dielectric film 24, a step generally identical in height to the lower wire 22 and the fuse 23 is caused between a portion formed on the first interlayer dielectric film 21 and another portion formed on the lower wire 22 and the fuse 23.

A TEOS (tetraethoxysilane) film 25 is formed on the second interlayer dielectric film 24, to cancel the step caused on the surface of the second interlayer dielectric film 24. The surface of the TEOS film 25 is generally flush with the surface of the portion of the second interlayer dielectric film 24 formed on the lower wire 22 and the fuse 23.

A third interlayer dielectric film 26 is stacked on the second interlayer dielectric film 24 and the TEOS film 25. The third interlayer dielectric film 26 is made of SiN (silicon nitride). In the third interlayer dielectric film 26, an opening 26a is formed on a portion above the fuse 23.

The second interlayer dielectric film 24 and the third interlayer dielectric film 26 are provided with a via hole 27 passing through the same in the thickness direction, in portions opposed to the lower wire 22 in the thickness direction. The via hole 27 is so tapered that the opening area thereof is increased upward.

On the third interlayer dielectric film 26, an upper wire 28 as an uppermost wire and the alignment mark 6 are formed on positions at an interval from each other.

The upper wire 28 is formed on a region including the via hole 27 in plan view, to protrude upward from the third interlayer dielectric film 26. The upper wire 28 has such a thickness that the quantity of protrusion from the surface of the third interlayer dielectric film 26 is not less than 2 μm (10 μm, for example), for example. The lower end portion of the upper wire 28 enters the via hole 27, and is connected to the lower wire 22. The upper wire 28 is made of Cu.

A barrier film 30 having a barrier property against diffusion of Cu ions and Au is interposed between the upper wire 28 and the lower wire 22, the second interlayer dielectric film 24 and the third interlayer dielectric film 26. The barrier film 30 is made of Ti (titanium).

The surfaces (the upper surface and the side surfaces) of the upper wire 28 are covered with a barrier film 32 having a barrier property against diffusion of Cu ions and Au. The barrier film 32 is made of Ti.

The surface of the barrier film 32 is covered with a wire covering film 31. The wire covering film 31 and the alignment mark 6 are made of the same material (Al).

A passivation film 33 is formed on the third interlayer dielectric film 26 and the wire covering film 31. The passivation film 33 is made of SiN. In the passivation film 33, a pad opening 34 for partially exposing the upper surface of the wire covering film 31 as a pad electrode 5 (see FIG. 1) is formed on a portion formed on the wire covering film 31, to pass through the passivation film 33 in the thickness direction. The passivation film 33 is partially removed from the alignment mark 6, a peripheral portion thereof and the portion above the fuse 23, to be provided with openings 38 and 39.

An end portion of a bonding wire 35 made of Au is bonded to the pad electrode 5 (the portion of the wire covering film 31 exposed from the pad opening 34). The other end portion of the bonding wire 35 is connected to an outer portion of the semiconductor device 1. Thus, the bonding wire 35 is electrically connected with the lower wire 22 through the wire covering film 31, the barrier films 30 and 32 and the upper wire 28.

Figure 3:
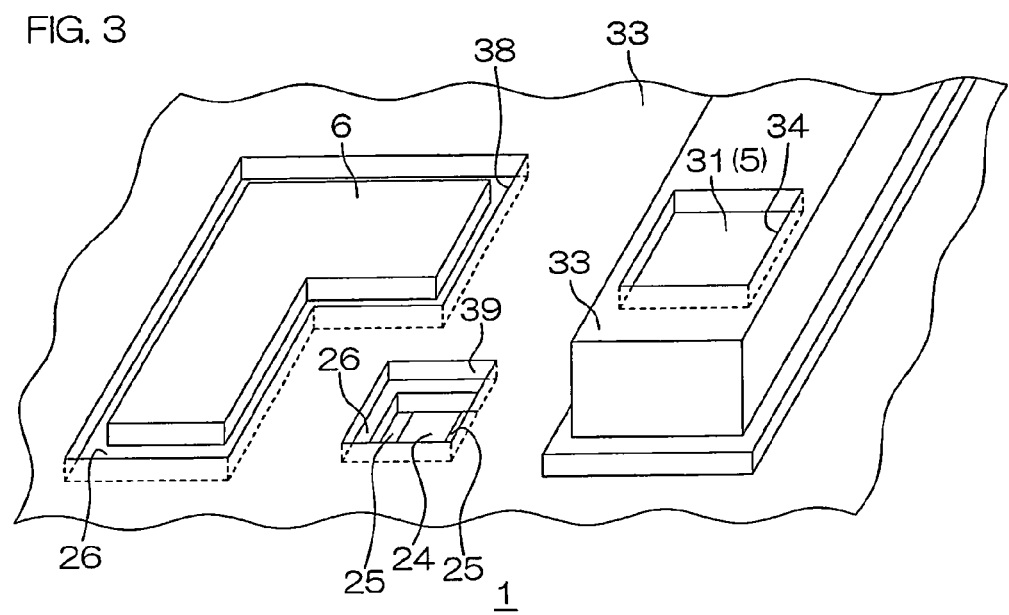
FIG. 3 is a perspective view of the semiconductor device shown in FIG. 2.

FIG. 3 is a perspective view of the semiconductor device 1 shown in FIG. 2. In FIG. 3, illustration of the bonding wire 35 shown in FIG. 2 is omitted.

As shown in FIG. 3, the alignment mark 6 is L-shaped in plan view. The passivation film 33 is partially removed from the alignment mark 6 and the peripheral portion thereof. Thus, the passivation film 33 is provided with the opening 38, L-shaped in plan view, exposing the alignment mark 6, and the opening 39 arranged in the region above the fuse 23.

FIGS. 4A to 4F are schematic sectional views successively showing the steps of manufacturing the semiconductor device 1 shown in FIG. 2.

In the manufacturing steps for the semiconductor device 1, the first interlayer dielectric film 21 is first stacked on the substrate 20 by CVD (Chemical Vapor Deposition). Thereafter an Al film for serving as the material for the lower wire 22 and the fuse 23 is formed on the first interlayer dielectric film 21 by sputtering. Then, the Al film is patterned by photolithography and etching, thereby forming the lower wire 22 and the fuse 23.

Then, the second interlayer dielectric film 24 is formed on the first interlayer dielectric film 21, the lower wire 22 and the fuse 23 by HDP (High Density Plasma)-CVD. Thereafter the TEOS film 25 is formed on the second interlayer dielectric film 24 by CVD. Then, the TEOS film 25 is polished from the surface thereof by CMP (Chemical Mechanical Polishing). The TEOS film 25 is polished until the surface of the TEOS film 25 and the surface of the portion of the second interlayer dielectric film 24 formed on the lower wire 22 and the fuse 23 are flush with each other.

Figure 4A:
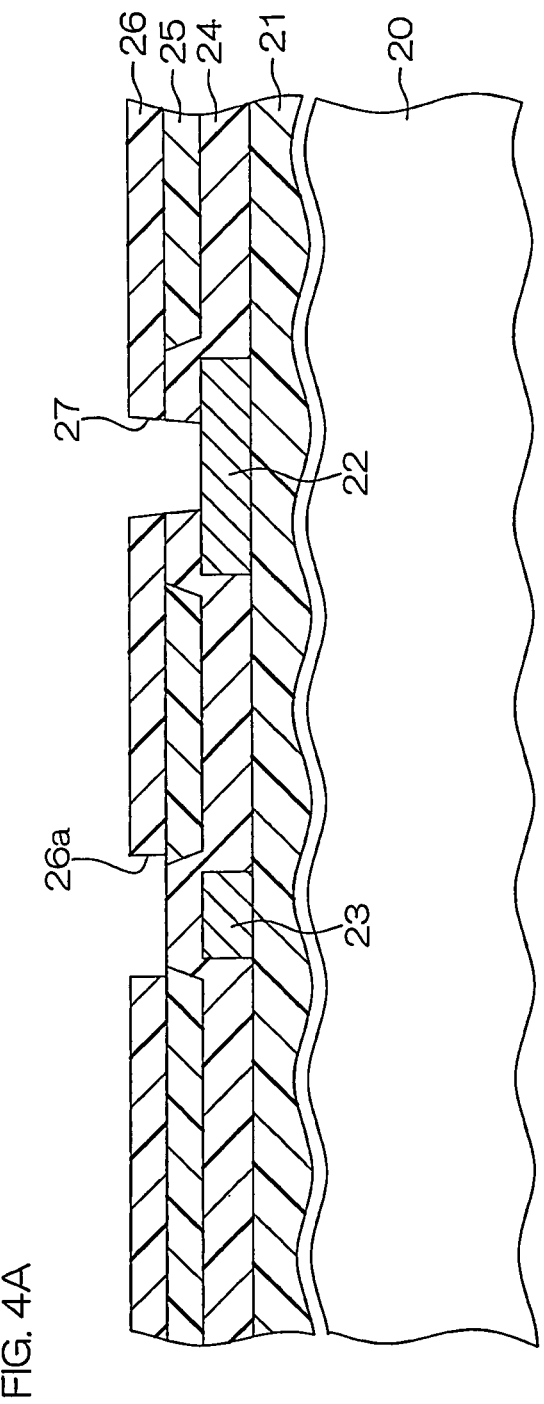
FIGS. 4A to 4F are schematic sectional views successively showing the steps of manufacturing the semiconductor device shown in FIG. 2.

Then, the third interlayer dielectric film 26 is formed on the second interlayer dielectric film 24 and the TEOS film 25 by plasma CVD. Thereafter the second and third interlayer dielectric films 24 and 26 are selectively removed by photolithography and etching as shown in FIG. 4A, to form the via hole 27 passing through the second and third interlayer dielectric films 24 and 26 in the thickness direction. In the region above the fuse 23, the third interlayer dielectric film 26 is selectively removed, to form the opening 26a passing through the third interlayer dielectric film 26.

Figure 4B:
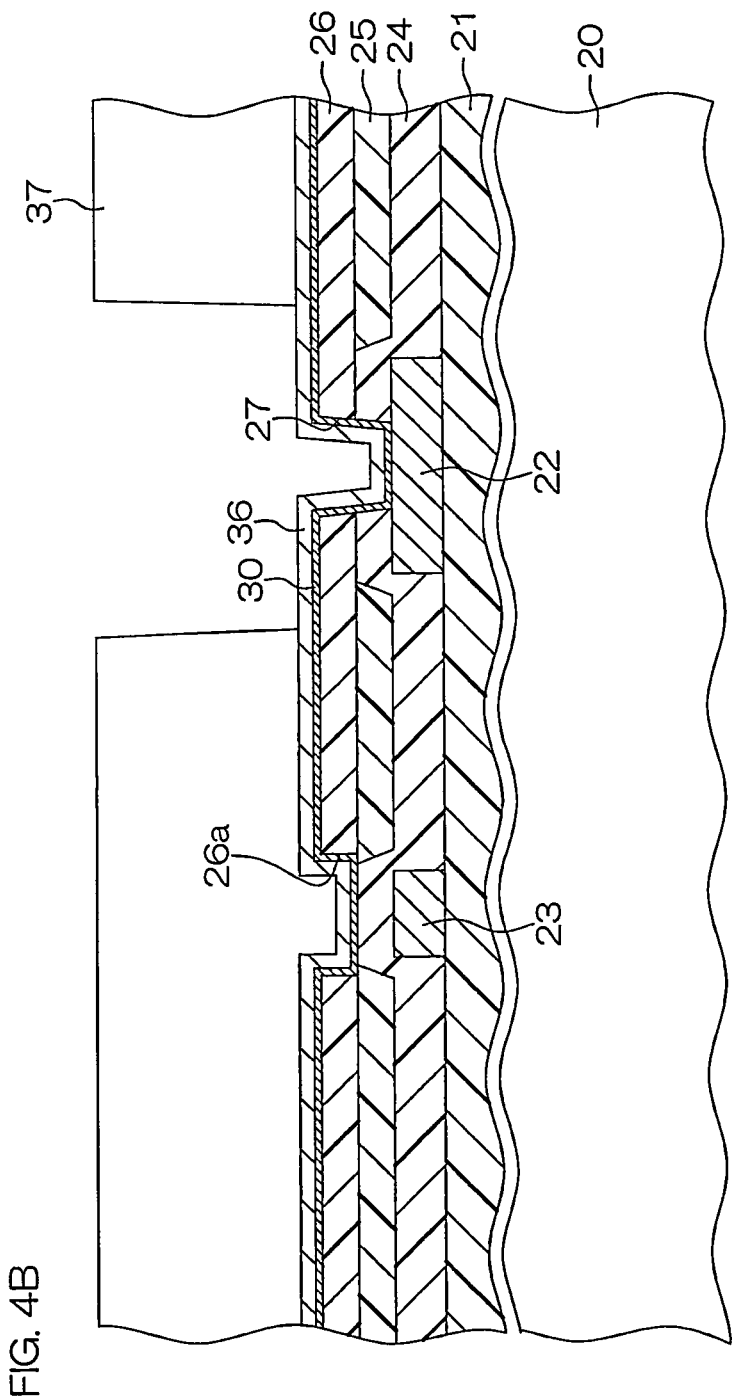

Then, the barrier film 30 is formed on the third interlayer dielectric film 26 including the inner surface of the via hole 27 by sputtering, as shown in FIG. 4B. Then, a seed film 36 made of Cu is formed on the barrier film 30 by sputtering. Thereafter a resist pattern 37 having an opening in a portion opposed to the region including the via hole 27 in plan view is formed on the barrier film 30 and the seed film 36.

Figure 4C:
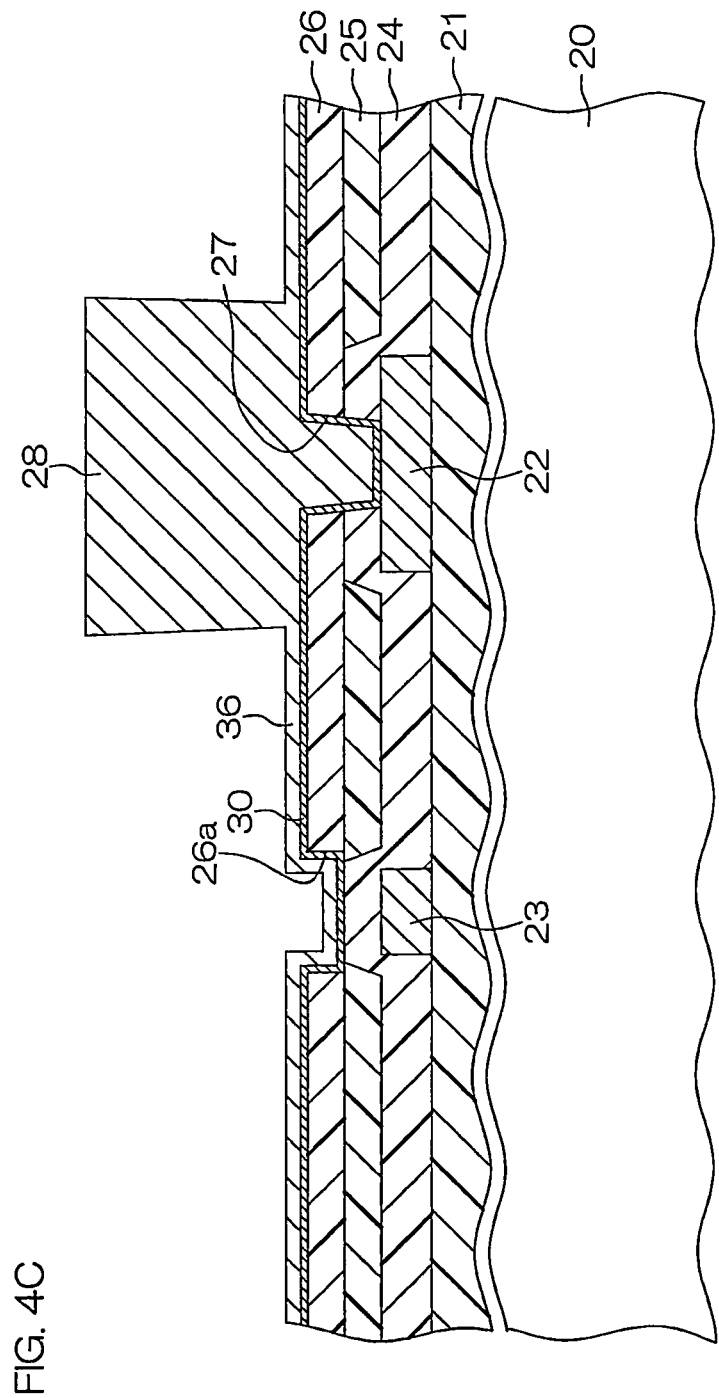

Then, Cu is grown by plating in the opening of the resist pattern 37. Thus, the opening of the resist pattern 37 is filled up with Cu, to form the upper wire 28 made of Cu as shown in FIG. 4C. After the formation of the upper wire 28, the resist pattern 37 is removed.

Figure 4D:
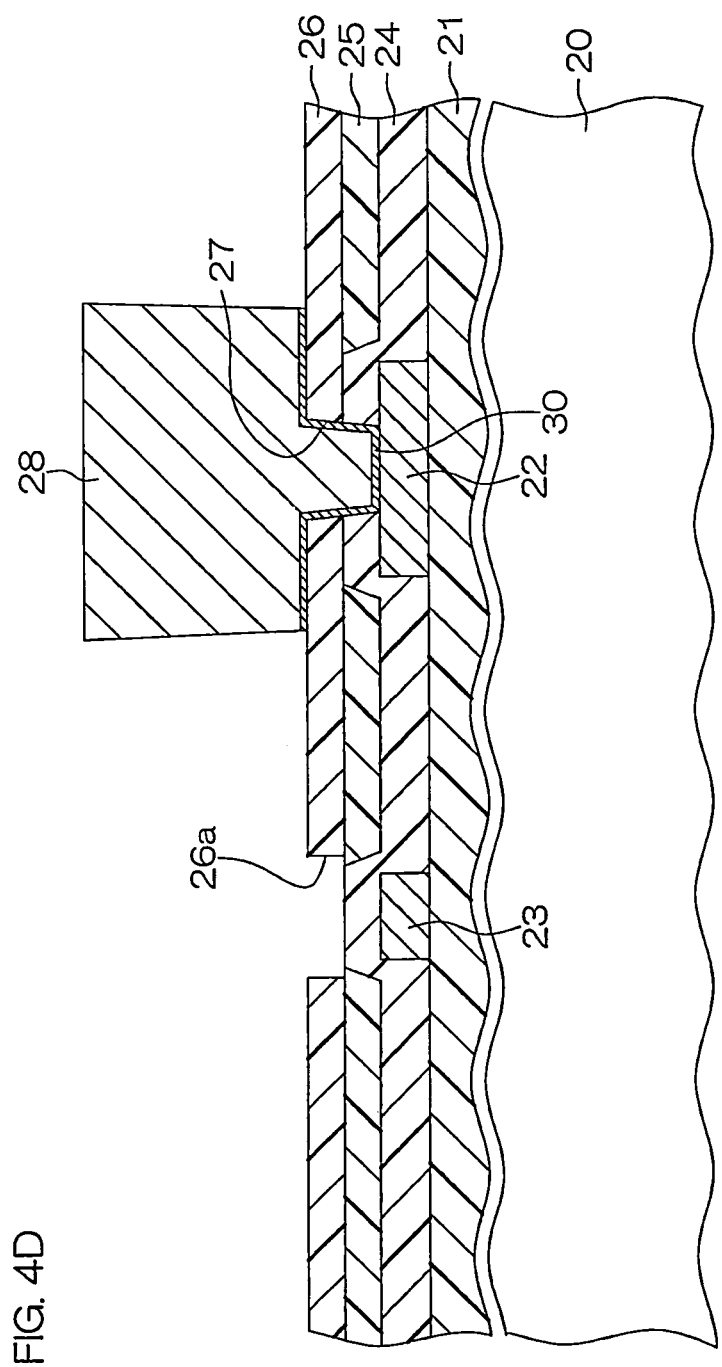

Thereafter portions of the barrier film 30 and the seed film 36 having been formed under the resist pattern 37 are removed by etching, as shown in FIG. 4D.

Figure 4E:
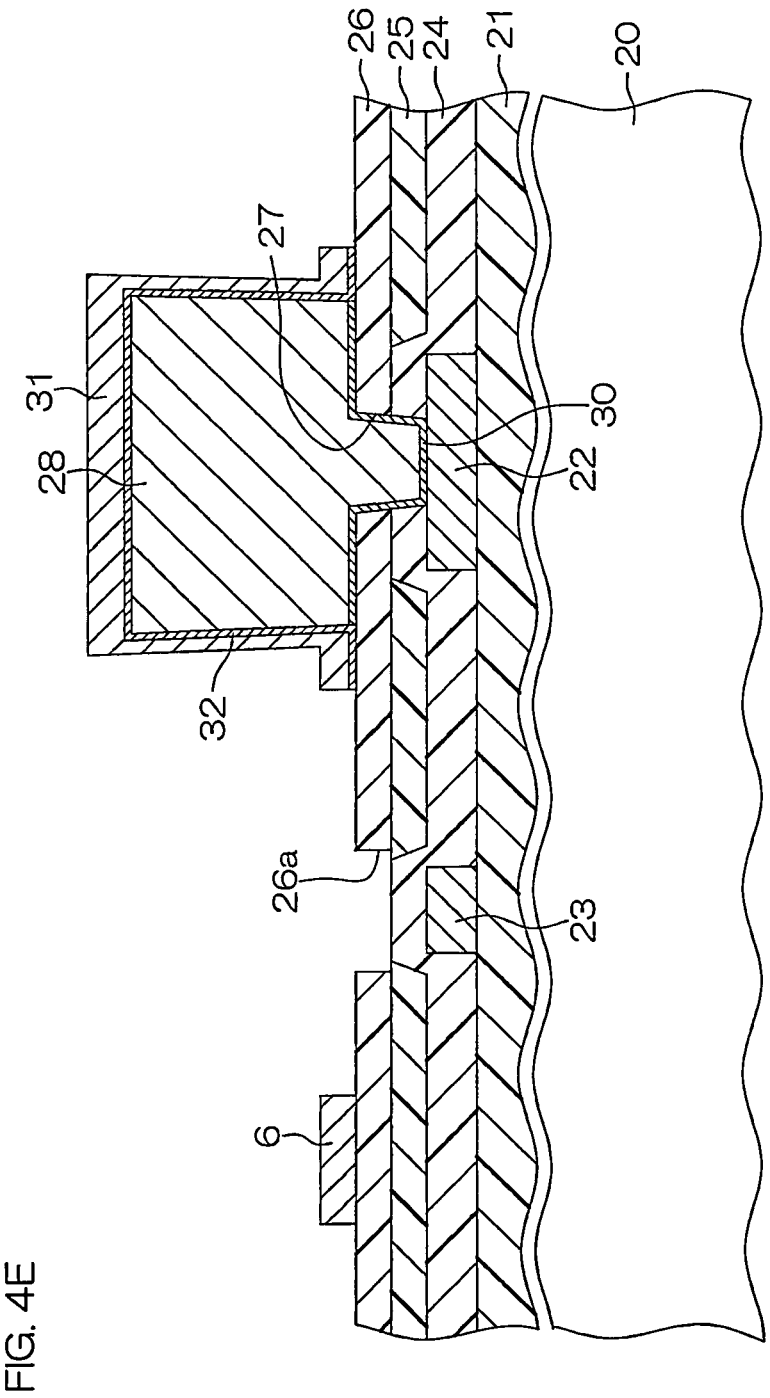

Then, a Ti film and an Al film are formed in this order on the third interlayer dielectric film 26 and the upper wire 28 by sputtering. Then, the Ti film and the Al film are selectively removed by photolithography and dry etching (RIE, for example), to form the wire covering film 31, the barrier film 32 and the alignment mark 6 as shown in FIG. 4E.

Figure 4F:
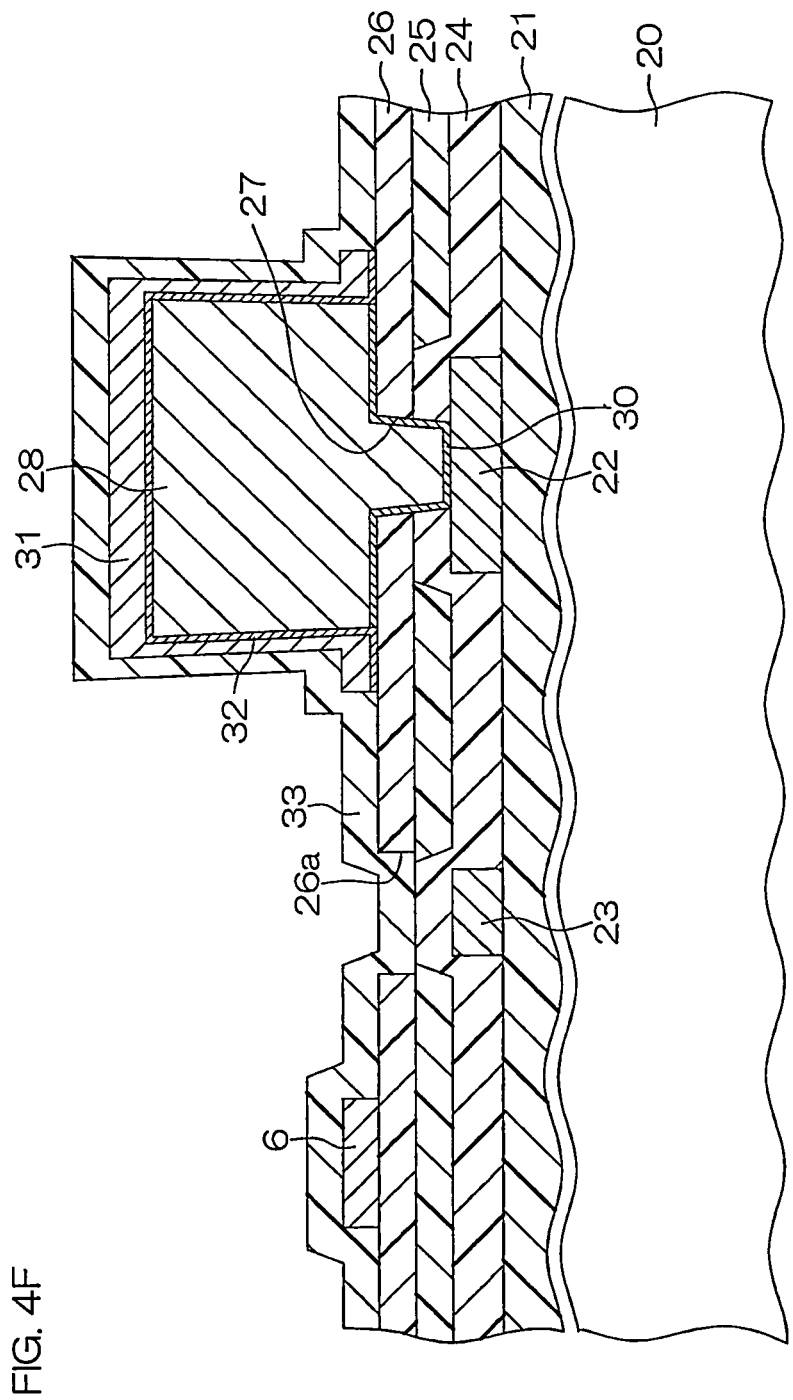

Thereafter the passivation film 33 is formed on the third interlayer dielectric film 26, the wire covering film 31 and the alignment mark 6 by CVD, as shown in FIG. 4F.

Then, the pad opening 34 is formed in the passivation film 33 by photolithography and etching while the passivation film 33 is partially removed from the alignment mark 6, the peripheral portion thereof and the portion above the fuse 23, to be provided with the openings 38 and 39. Thereafter the end portion of the bonding wire 35 is bonded to the portion of the upper wire 28 (the wire covering film 31) exposed from the pad opening 34, thereby obtaining the semiconductor device 1 shown in FIGS. 1, 2 and 3.

In the semiconductor device 1, as hereinabove described, the upper wire 28 made of copper is formed on the third interlayer dielectric film 26. The surface of the upper wire 28 is covered with the wire covering film 31 made of aluminum. The passivation film 33 is formed on the third interlayer dielectric film 26, and the upper wire 28 whose surface is covered with the wire covering film 31 is covered with the passivation film 33 on the outer side thereof.

Al employed as the material for the wire covering film 31 has high adhesiveness to Cu employed as the material for the upper wire 28. Therefore, the wire covering film 31 excellently adheres to the surface of the upper wire 28. Further, Al employed as the material for the wire covering film 31 has high adhesiveness to the insulating material (SiN) employed as the material for the passivation film 33. Therefore, the passivation film 33 excellently adheres to the surface of the wire covering film 31. Therefore, the passivation film 33 can be prevented from separating from the upper wire 28.

The upper wire 28 is covered with the wire covering film 31 made of Al, whereby the bonding wire 35 can be directly bonded to the portion of the wire covering film 31 exposed from the pad opening 34 formed in the passivation film 33. Therefore, no bonding pad may be provided on the upper wire 28, whereby neither a step of forming a bonding pad nor a layer used for the step is necessary.

The bonding wire 35 made of Au is bonded to the portion of the wire covering film 31 exposed from the pad opening 34. The barrier film 32 having the barrier property against diffusion of Au is interposed between the wire covering film 31 and the upper wire 28. Thus, Au in the bonding wire 35 can be prevented from diffusing into the upper wire 28.

The barrier film 32 has the barrier property against diffusion of Cu. Thus, Cu (Cu ions) can be prevented from diffusing from the upper wire 28, whereby formation of a leakage path between the upper wire 28 and another uppermost wire can be reliably prevented.

The wire covering film 31 is formed by forming the Ti film and the Al film to collectively cover the surfaces of the third interlayer dielectric film 26 and the upper wire 28 after the formation of the upper wire 28 and removing unnecessary portions of the Ti film and the Al film located on the third interlayer dielectric film 26, as shown in FIG. 4E. At this time, dry etching such as RIE executable at a lower cost than wet etching is employed as the technique for removing the unnecessary portions of the Ti film and the Al film. Thus, the manufacturing cost for the semiconductor device 1 can be reduced.

The alignment mark 6 is formed on the surface of the third interlayer dielectric film 26. The wire covering film 31 and the alignment mark 6 are made of the same material (Al). The surfaces of the third interlayer dielectric film 26 and the wire covering film 31 are covered with the passivation film 33 made of the insulating material. The opening 38 exposing the alignment mark 6 is formed in the passivation film 33.

The alignment mark 6 is made of Al having higher light reflectance than Cu. Therefore, the recognition accuracy for the position (X- and Y-positions) of the alignment mark 6 can be increased. Thus, the position of the alignment mark 6 can be accurately recognized in the structure having the upper wire 28 made of Cu.

The alignment mark 6 and the wire covering film 31 are made of the same material, whereby the alignment mark 6 and the wire covering film 31 can be collectively formed. Thus, the number of the manufacturing steps can be reduced.

The fuse 23 is formed under the third interlayer dielectric film 26. The characteristic values (the resistance etc., for example) of the power transistor circuits 4 (see FIG. 1) can be adjusted by whether or not cutting the fuse 23. Further, the alignment mark 6 is formed on the surface of the third interlayer dielectic film 26. This reduces the distance between the alignment mark 6 and the fuse 26 as compared to a structure having an alignment mark 6 formed on the upper wire 28. Highly precise recognition of the position of fuse 23 (X-, Y- and Z-positions) becomes possible accordingly, and the process precision of cutting the fuse 23 is improved.

Figure 5:
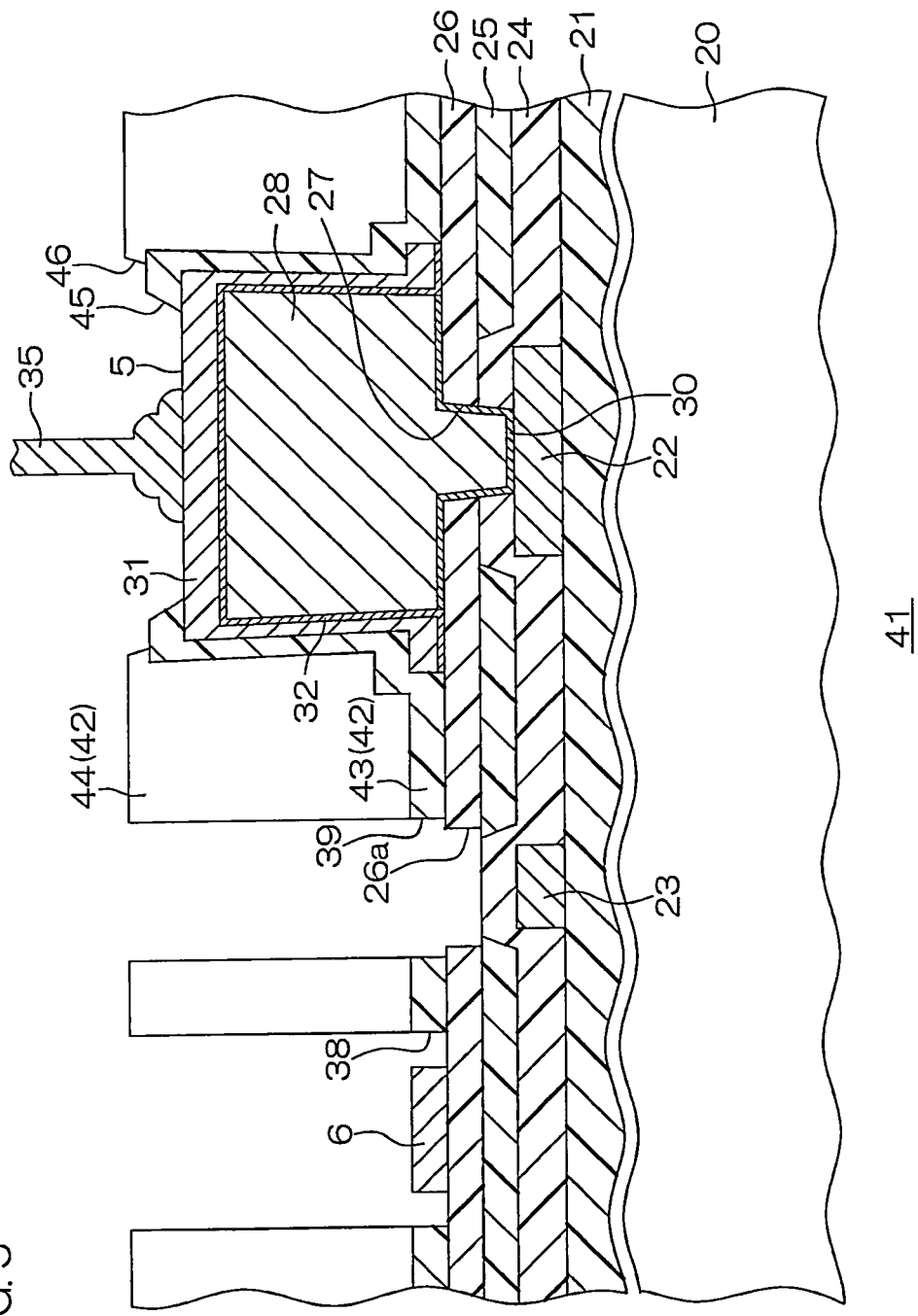
FIG. 5 is a schematic sectional view showing a first modification of the semiconductor device shown in FIGS. 1 to 3.
Figure 6:
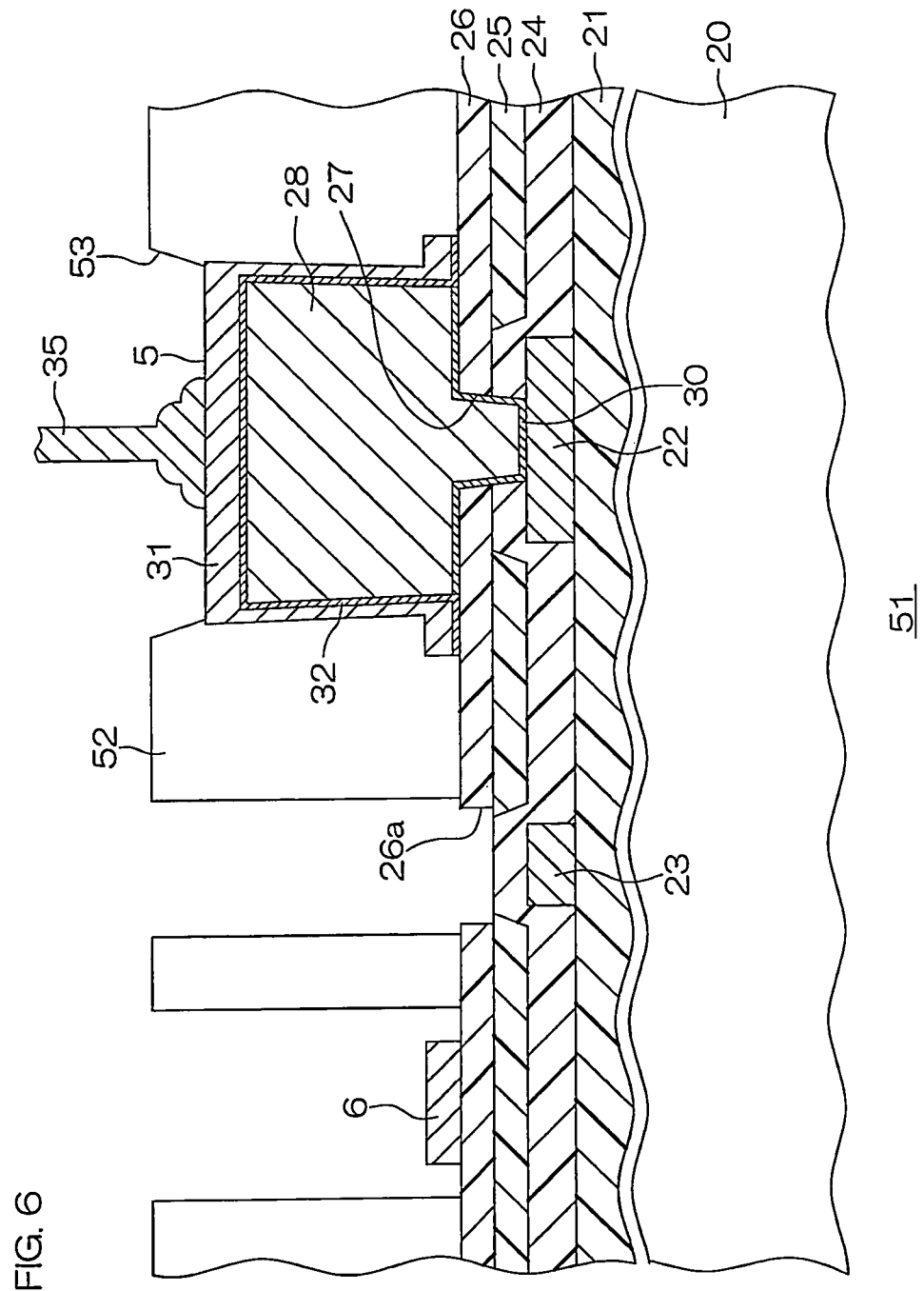
FIG. 6 is a schematic sectional view showing a second modification of the semiconductor device shown in FIGS. 1 to 3.
Figure 7:
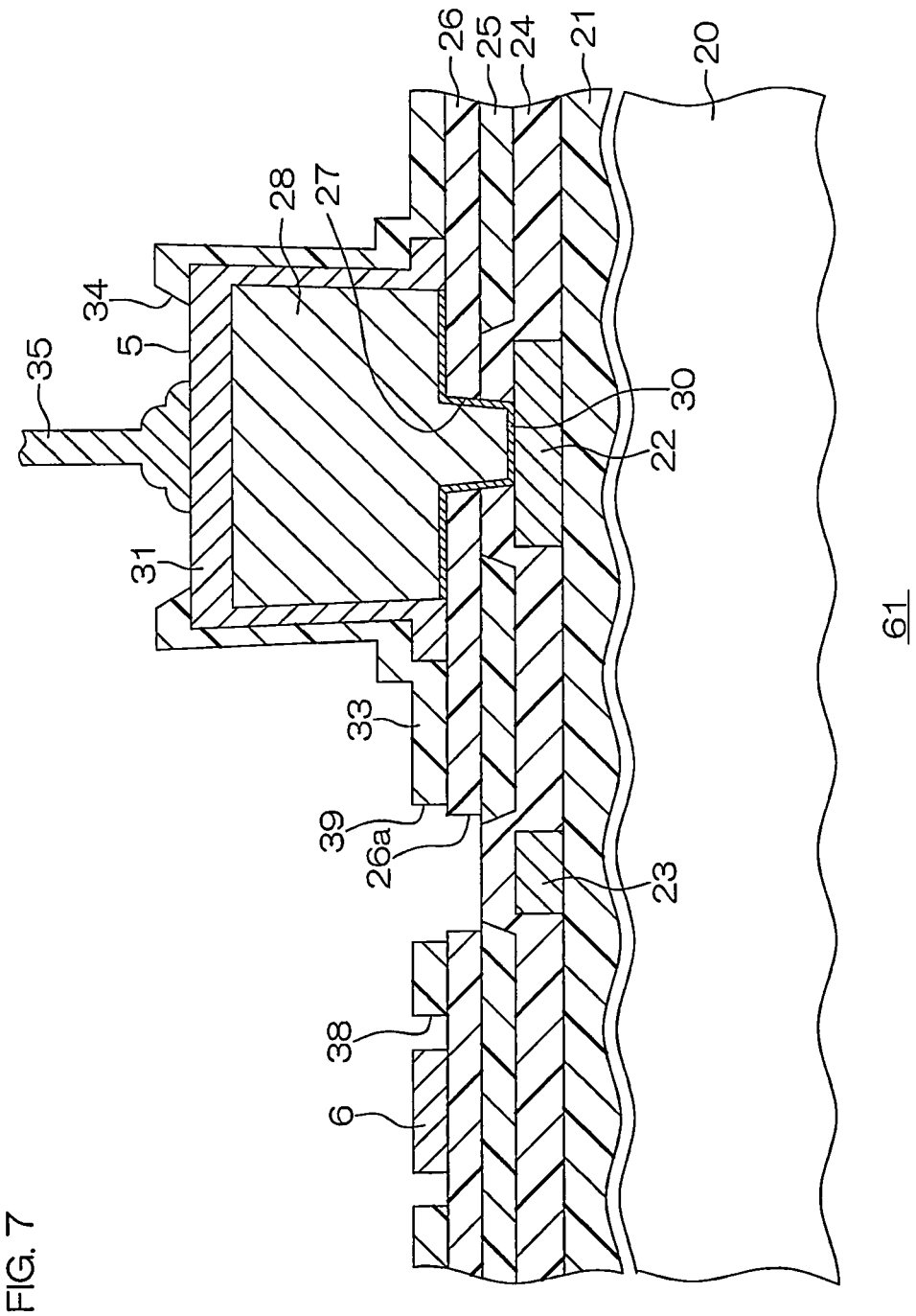
FIG. 7 is a schematic sectional view showing a third modification of the semiconductor device shown in FIGS. 1 to 3.

FIG. 5 is a schematic sectional view of a semiconductor device according to a first modification of the first embodiment. Referring to FIGS. 5 to 7 described below, portions corresponding to those shown in FIG. 2 are denoted by the same reference numerals respectively. In the following, redundant description is omitted as to the portions denoted by the same reference numerals.

A semiconductor device 41 is provided with a passivation film 42 having a multilayer structure of a nitride film 43 and an organic film 44, in place of the passivation film 33 of the semiconductor device 1 shown in FIG. 2.

The nitride film 43 is made of silicon nitride. The nitride film 43 is formed on a third interlayer dielectric film 26 and a wire covering film 31. In a portion of the nitride film 43 formed on the wire covering film 31, a pad opening 45 for partially exposing the upper surface of the wire covering film 31 as a pad electrode 5 is formed to pass through the nitride film 43 in the thickness direction. The nitride film 43 is partially removed from a portion above an alignment mark 6, a peripheral portion thereof and a portion above a fuse 23.

An upper wire 28 is formed to protrude on the third interlayer dielectric film 26, and hence a step generally equal in thickness to the upper wire 28 and the wire covering film 31 is caused on the surface of the nitride film 43 between a portion formed on the wire covering film 31 covering the upper wire 28 and another portion formed on the third interlayer dielectric film 26.

The organic film 44 is formed to cancel the step caused on the surface of the nitride film 43. The organic film 44 is made of an organic material (polyimide or epoxy resin, for example). The organic film 44 is provided with an opening 46 communicating with the pad opening 45 in a region including the portion provided with the pad opening 45 in plan view. The organic film 44 is partially removed from a portion above the alignment mark 6, the peripheral portion thereof and the portion above the fuse 23.

Also according to this structure, advantages similar to those of the semiconductor device 1 shown in FIG. 2 can be attained.

Further, the organic film 44 is formed on the nitride film 43, to cancel the step on the surface of the nitride film 43. When stress is applied to the upper wire 28 (the wire covering film 31), therefore, the organic film 44 can absorb the stress.

In addition, the passivation film 42 has the multilayer structure of the nitride film 43 and the organic film 44. Even if the organic film 44 is damaged by a filler contained in the material for a resin package to seal the semiconductor device 41, therefore, the nitride film 43 is not damaged, but can ensure the function (prevention of infiltration of moisture etc.) of the passivation film. Thus, the reliability of the semiconductor device 41 can be improved.

FIG. 6 is a schematic sectional view of a semiconductor device according to a second modification of the first embodiment.

A semiconductor device 51 includes a passivation film 52, in place of the passivation film 33 of the semiconductor device 1 shown in FIG. 2. The passivation film 52 is an organic film made of an organic material such as polyimide or epoxy resin, for example.

An upper wire 28 is formed to protrude on a third interlayer dielectric film 26, and hence a step generally equal in thickness to the upper wire 28 and a wire covering film 31 is caused between the surface of the wire covering film 31 covering the upper wire 28 and the surface of the third interlayer dielectric film 26.

The passivation film 52 is formed on the third interlayer dielectric film 26 and the wire covering film 31, to cancel the step caused between the surface of the wire covering film 31 and the surface of the third interlayer dielectric film 26.

In a portion of the passivation film 52 formed on the wire covering film 31, a pad opening 53 for partially exposing the upper surface of the wire covering film 31 as a pad electrode 5 is formed to pass through the passivation film 52 in the thickness direction. The passivation film 52 is partially removed from a portion above an alignment mark 6, a peripheral portion thereof and a portion above a fuse 23.

Also according to this structure, advantages similar to those of the semiconductor device 1 shown in FIG. 2 can be attained. Further, the passivation film 52 fills up the step between the surface of the wire covering film 31 and the surface of the upper wire 28. When stress is applied to the upper wire 28 (the wire covering film 31), therefore, the passivation film 52 can absorb the stress.

FIG. 7 is a schematic sectional view showing a semiconductor device according to a third modification of the first embodiment.

A semiconductor device 61 shown in FIG. 7 has no barrier film 32 interposed between an upper wire 28 and a wire covering film 31. A bonding wire 35 is made of Cu.

When the bonding wire 35 is made of Cu, no defect (electromigration) is caused between the bonding wire 35 and the upper wire 28 by migration of metallic ions, whereby the barrier film 32 shown in FIG. 2 can be omitted. Thus, the manufacturing cost for the semiconductor device 61 can be reduced.

Figure 8:
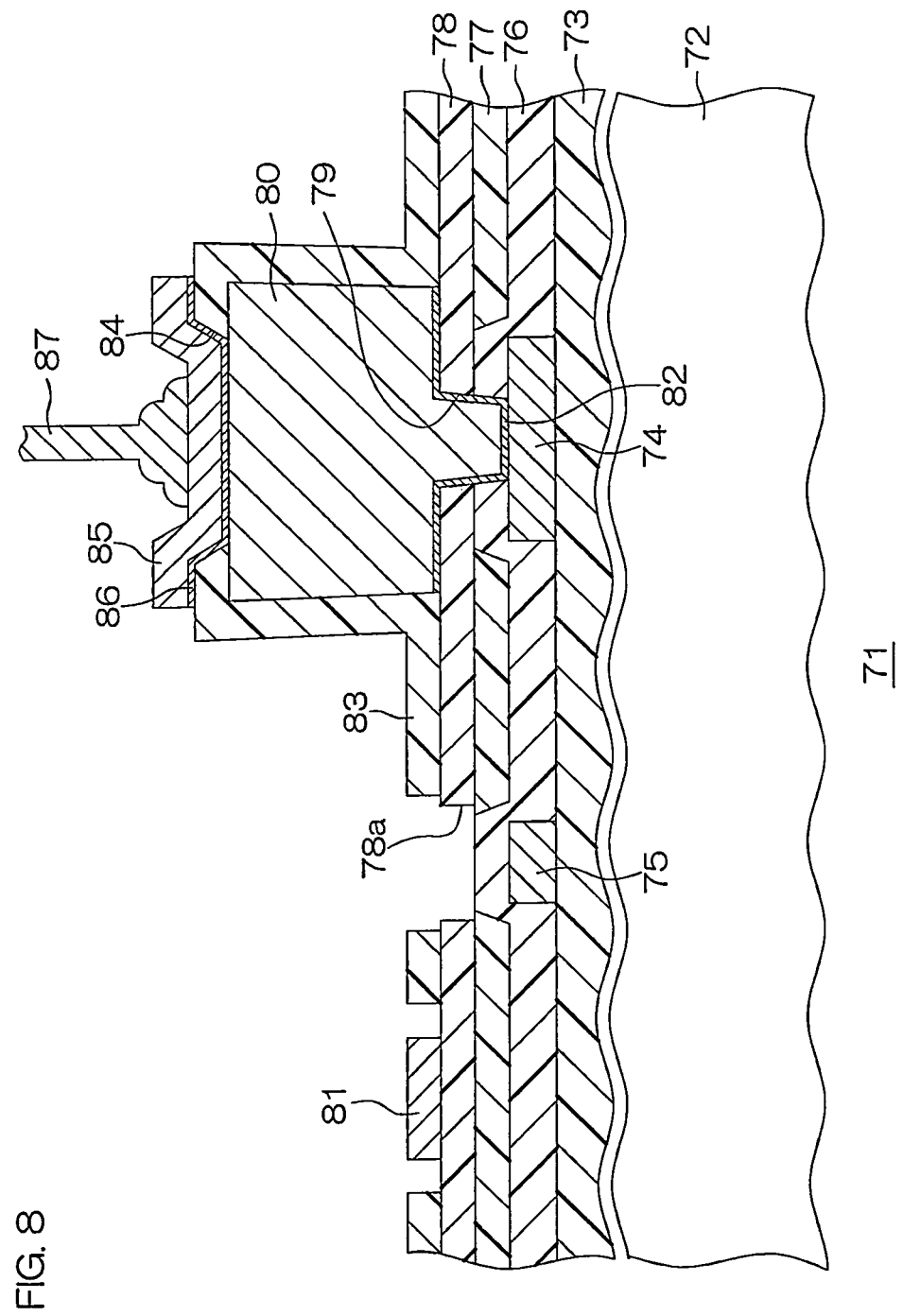
FIG. 8 is a schematic sectional view of a semiconductor device according to a second embodiment of the present invention.

FIG. 8 is a schematic sectional view of a semiconductor device according to a second embodiment of the present invention.

A semiconductor device 71 shown in FIG. 8 includes a substrate 72 made of Si as the base thereof. A first interlayer dielectric film 73 is stacked on the substrate 72. The first interlayer dielectric film 73 is made of $SiO_2$.

A lower wire 74 and a fuse 75 are formed on the first interlayer dielectric film 73 at an interval from each other. The lower wire 74 and the fuse 75 are made of Al.

A second interlayer dielectric film 76 is stacked on the first interlayer dielectric film 73, the lower wire 74 and the fuse 75. The second interlayer dielectric film 76 is made of $SiO_2$. On the surface of the second interlayer dielectric film 76, a step generally identical in height to the lower wire 74 and the fuse 75 is caused between a portion formed on the first interlayer dielectric film 73 and another portion formed on the lower wire 74 and the fuse 75.

A TEOS film 77 is formed on the second interlayer dielectric film 76, to cancel the step caused on the surface of the second interlayer dielectric film 76. The surface of the TEOS film 77 is generally flush with the surface of the portion of the second interlayer dielectric film 76 formed on the lower wire 74 and the fuse 75.

A third interlayer dielectric film 78 is stacked on the second interlayer dielectric film 76 and the TEOS film 77. The third interlayer dielectric film 78 is made of SiN. In the third interlayer dielectric film 78, an opening 78a is formed on a portion above the fuse 75.

The second interlayer dielectric film 76 and the third interlayer dielectric film 78 are provided with a via hole 79 passing through the third interlayer dielectic film 78 in the thickness direction on portions opposed to the lower wire 74 in the thickness direction. The via hole 79 is so tapered that the opening area thereof is increased upward.

On the third interlayer dielectric film 78, an upper wire 80 as an uppermost wire and an alignment mark 81 are formed on positions at an interval from each other.

The upper wire 80 is formed on a region including the via hole 79 in plan view, to protrude upward from the third interlayer dielectric film 78. The upper wire 80 has such a thickness that the quantity of protrusion from the surface of the third interlayer dielectric film 78 is not less than 2 μm (10 μm, for example), for example. The lower end portion of the upper wire 80 enters the via hole 79, and is connected to the lower wire 74. The upper wire 80 is made of Cu.

A barrier film 82 having a barrier property against diffusion of Cu ions and Au is interposed between the upper wire 80 and the lower wire 74, the second interlayer dielectric film 76 and the third interlayer dielectric film 78. The barrier film 82 is made of Ti.

The surfaces of the third interlayer dielectric film 78 and the upper wire 80 are covered with a passivation film 83. The passivation film 83 is made of SiN. In a portion of the passivation film 83 formed on the upper wire 80, a pad opening 84 for exposing the upper surface of the upper wire 80 is formed to pass through the passivation film 83 in the thickness direction. The passivation film 83 is partially removed from a portion above the alignment mark 81, a peripheral portion thereof and a portion above the fuse 75.

A pad electrode 85 as a wire covering film is formed on the portion of the upper wire 80 exposed from the pad opening 84. The pad electrode 85 is made of the same material (Al) as the alignment mark 81. The pad electrode 85 covers the surface of the upper wire 80, while the peripheral edge portion thereof extends onto a portion of the passivation film 83 around the pad opening 84.

A barrier film 86 having a barrier property against diffusion of Cu ions and Au is interposed between the pad electrode 85 and the upper wire 80 and the passivation film 83. The barrier film 86 is made of Ti.

An end portion of a bonding wire 87 made of Au is bonded to the upper surface of the pad electrode 85. The other end portion of the bonding wire 87 is connected to an outer portion of the semiconductor device 71. Thus, the bonding wire 87 is electrically connected with the lower wire 74 through the pad electrode 85, the barrier films 82 and 86 and the upper wire 80.

Also according to this structure, advantages similar to those of the semiconductor device 1 shown in FIG. 2 can be attained.

Figure 9:
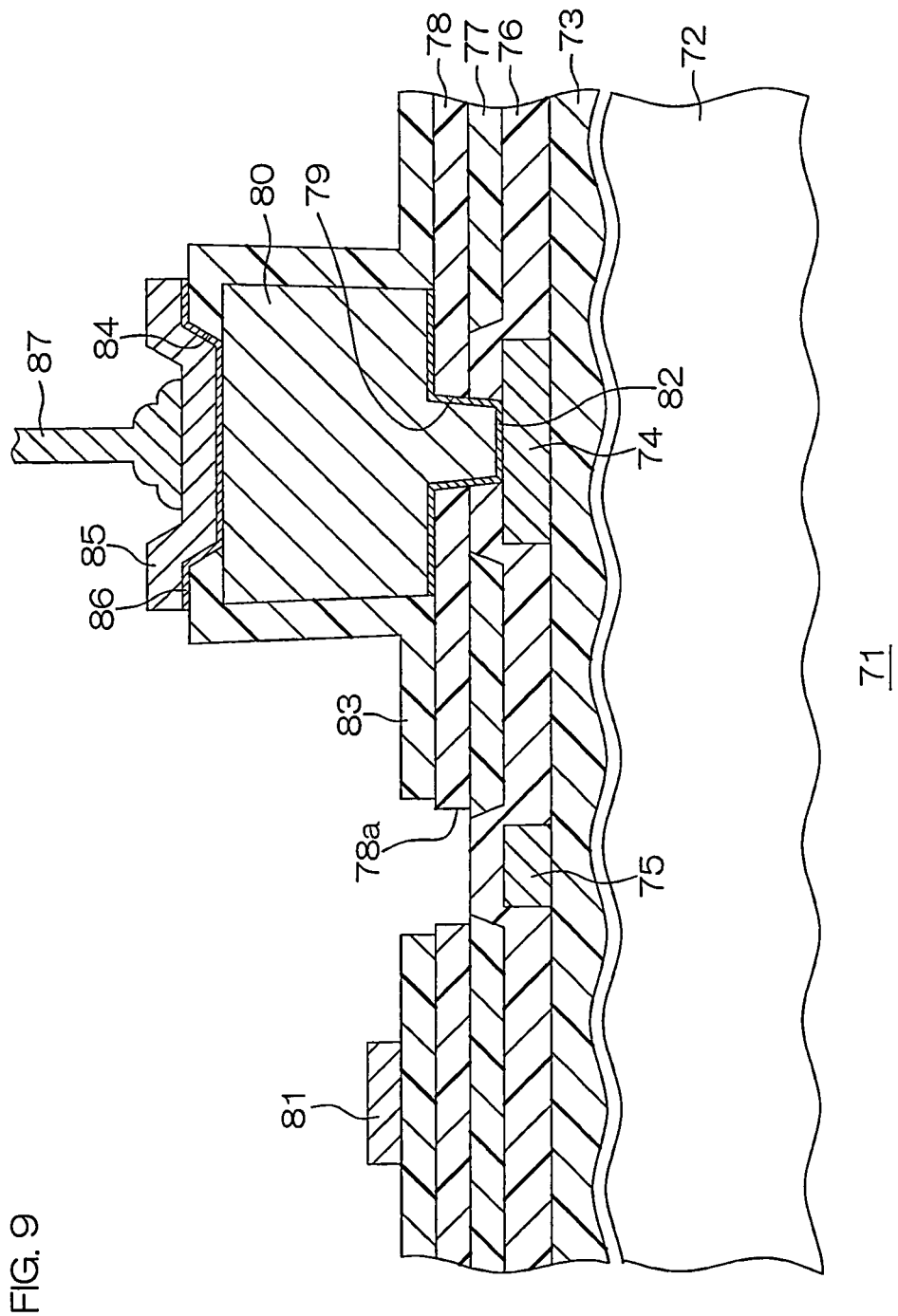
FIG. 9 is a schematic sectional view showing a first modification of the semiconductor device shown in FIG. 8.

FIG. 9 is a schematic sectional view showing a first modification of the semiconductor device 71 shown in FIG. 8.

As shown in FIG. 9, the alignment mark 81 may alternatively be formed on the passivation film 83. The thickness of the passivation film 83 is not less than 0.5 μm and not more than 3.0 μm, for example. Also when the alignment mark 81 is formed on the passivation film 83, therefore, the distance between the alignment mark 81 and the fuse 75 can be sufficiently reduced as compared with the structure in which the alignment mark 81 is formed on the upper wire 80 having the thickness of not less than 2 μm. Therefore, the recognition accuracy for the position (X-, Y- and Z-positions) of the fuse 75 can be improved, for improving the accuracy in working for cutting the fuse 75.

Figure 10:
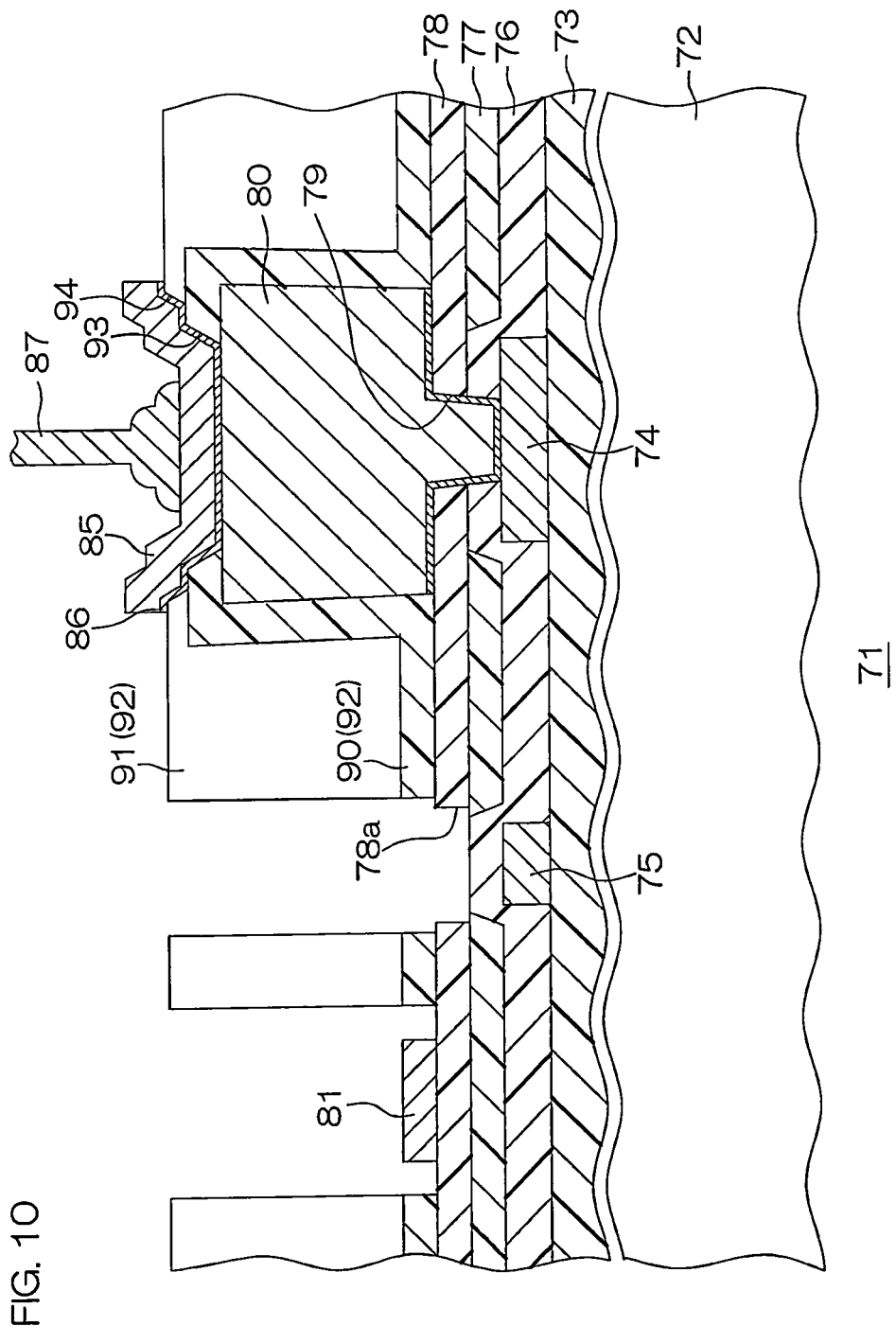
FIG. 10 is a schematic sectional view showing a second modification of the semiconductor device shown in FIG. 8.

FIG. 10 is a schematic sectional view showing a second modification of the semiconductor device 71 shown in FIG. 8.

As shown in FIG. 10, the semiconductor device 71 may alternatively be provided with a passivation film 92 having a multilayer structure of a nitride film 90 and an organic film 91, in place of the passivation film 83.

The nitride film 90 is made of silicon nitride. The nitride film 90 covers the surfaces of the third interlayer dielectric film 78 and the upper wire 80. In a portion of the nitride film 90 formed on the upper wire 80, a pad opening 93 for partially exposing the upper surface of the upper wire 80 is formed to pass through the nitride film 90 in the thickness direction. The nitride film 90 is partially removed from a portion above the alignment mark 81, the peripheral portion thereof and the portion above the fuse 75.

The upper wire 80 is formed to protrude on the third interlayer dielectric film 78, and hence a step generally equal in thickness to the upper wire 80 is caused on the surface of the nitride film 90 between a portion formed on the upper wire 80 and another portion formed on the third interlayer dielectric film 78.

The organic film 91 is formed to cancel the step caused on the surface of the nitride film 90. The organic film 91 is made of an organic material (polyimide or epoxy resin, for example). The organic film 91 is provided with an opening 94 communicating with the pad opening 93 in a region including the portion provided with the pad opening 93 in plan view.

The organic film 91 is partially removed from a portion above the alignment mark 81, the peripheral portion thereof and the portion above the fuse 75.

Figure 11:
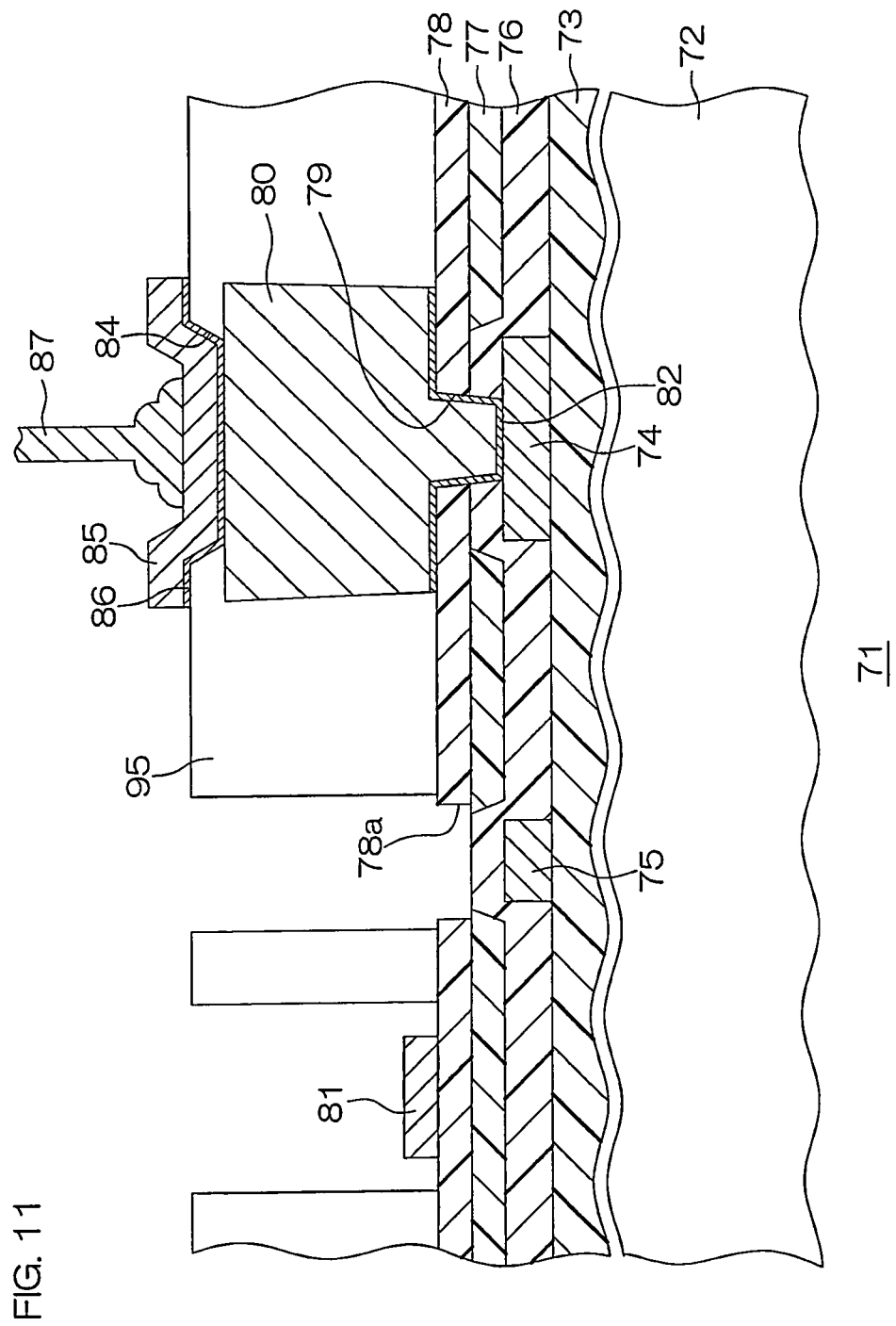
FIG. 11 is a schematic sectional view showing a third modification of the semiconductor device shown in FIG. 8.

FIG. 11 is a schematic sectional view showing a third modification of the semiconductor device 71 shown in FIG. 8.

As shown in FIG. 11, the semiconductor device 71 may alternatively include a passivation film 95, in place of the passivation film 83. The passivation film 95 is an organic film made of an organic material such as polyimide or epoxy resin, for example.

The upper wire 80 is formed to protrude on the third interlayer dielectric film 78, and hence a step generally equal in thickness to the upper wire 80 is caused between the surface of the upper wire 80 and the surface of the third interlayer dielectric film 78.

The passivation film 95 is formed on the third interlayer dielectric film 78 and the upper wire 80, to cancel the step caused between the surface of the upper wire 80 and the surface of the third interlayer dielectric film 78.

In a portion of the passivation film 95 formed on the upper wire 80, a pad opening 96 for partially exposing the upper surface of the upper wire 80 is formed to pass through the passivation film 95 in the thickness direction. The passivation film 95 is partially removed from a portion above the alignment mark 81, the peripheral portion thereof and the portion above the fuse 75.

Further modifications of the aforementioned first and second embodiments are as follows:

For example, while SiN is employed as the material for the third interlayer dielectric films 26 and 78, $SiO_2$ may alternatively be employed as the material for the third interlayer dielectric films 26 and 78. However, Cu ions more easily diffuse in $SiO_2$ than in SiN, and hence diffusion of Cu ions can be more excellently prevented by employing SiN as the material for the third interlayer dielectric films 26 and 78.

While Ti is employed as the material for the barrier films 30, 32, 82 and 86, the barrier films 30, 32, 82 and 86 need to simply be made of a material having conductivity and a barrier property against diffusion of Cu ions and Au. Examples of such a material include TiN (titanium nitride), WN (tungsten nitride), TaN (tantalum nitride), Ta (tantalum), W (tungsten) and TiW (a titanium-tungsten alloy), in addition to Ti. Single films of any of such materials may be employed as the barrier films 30, 32, 82 and 86, or the barrier films 30, 32, 82 and 86 may be formed by multilayer films made of two or more types of materials arbitrarily selected from these materials.

While Al is employed as the material for the wire covering film 31 and the pad electrode 85, the wire covering film 31 and the pad electrode 85 need to simply be made of a metallic material having high adhesiveness to Cu and the insulating material. Examples of such a metallic material include AlSiCu (a silicon compound of an aluminum-copper alloy) and AlCu (an aluminum-copper alloy), in addition to Al.

While polyimide or epoxy resin is employed as the material for the organic films 34 and 91 and the passivation films 42 and 95, the organic films 34 and 91 and the passivation films 42 and 95 may alternatively be made of PBO (polyparaphenylene benzobisoxazole) or BCB (benzocyclobutene), for example.

Figure 12:
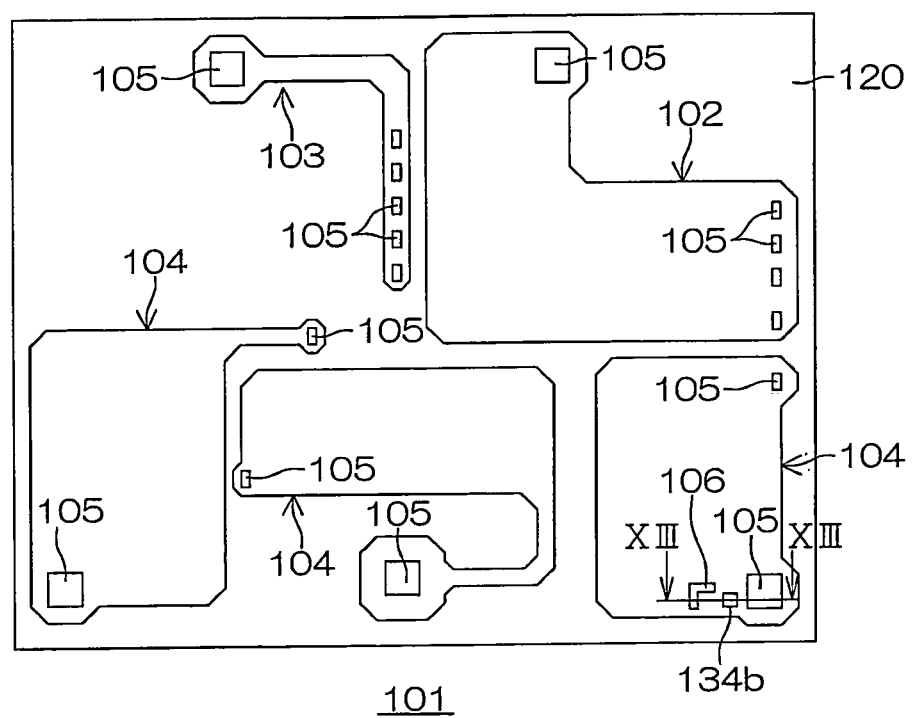
FIG. 12 is an illustrative plan view of a semiconductor device according to a third embodiment of the present invention.

FIG. 12 is an illustrative plan view of a semiconductor device according to a third embodiment of the present invention.

A semiconductor device 101 is provided with an analog circuit 102, a digital circuit 103 and three power transistor circuits 104. More specifically, the analog circuit 102 and the digital circuit 103 are horizontally arranged on the upper half region while the three power transistor circuits 104 are horizontally arranged on the lower half region in the plan view shown in FIG. 12.

In the regions provided with the circuits 102 to 104, a plurality of pad electrodes 105 for electrically connecting the circuits 102 to 104 with an external device are arranged on proper positions.

An alignment mark 106 L-shaped in plan view is arranged on a region provided with the right power transistor circuit 104 in FIG. 12.

The position (a θ-position) of the semiconductor device 101 around an axis orthogonal to the surface of the semiconductor device 101 can be detected by scanning the surface of the semiconductor device 101 with a laser beam and recognizing the alignment mark 106, for example. Further, the positions (X-, Y- and Z-positions) of the respective portions of the semiconductor device 101 can be detected on the basis of the position of the alignment mark 106.

Figure 13:
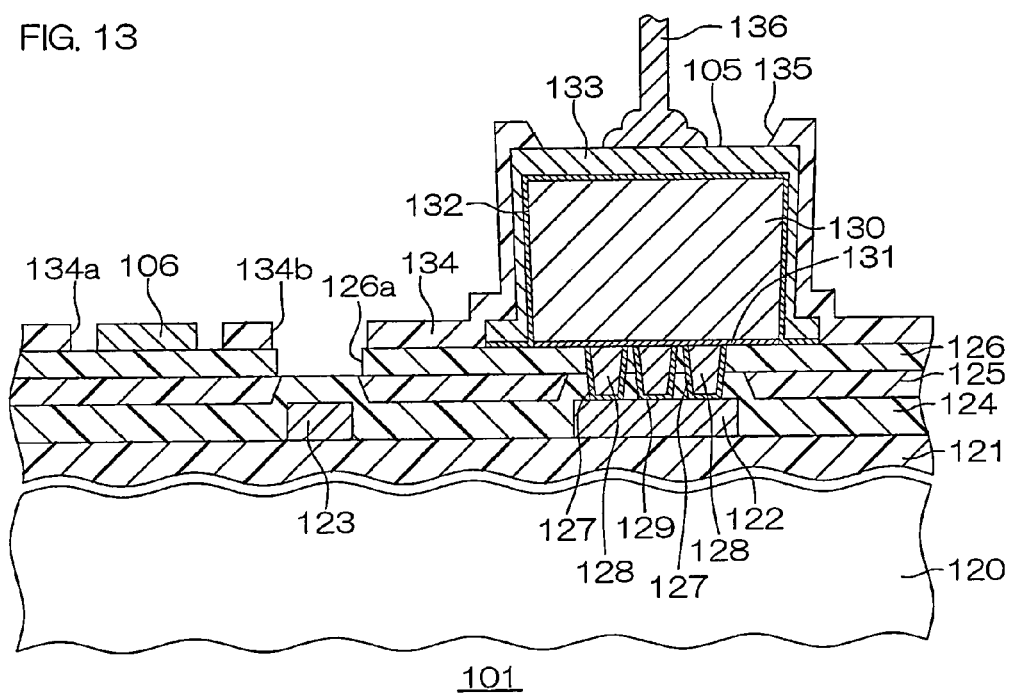
FIG. 13 is a sectional view of the semiconductor device taken along a line XIII-XIII in FIG. 12.

FIG. 13 is a sectional view of the semiconductor device 101 taken along a line XIII-XIII in FIG. 12.

As shown in FIG. 13, the semiconductor device 101 includes a substrate 120 made of Si (silicon) as the base thereof. A first interlayer dielectric film 121 is stacked on the substrate 120. The first interlayer dielectric film 121 is made of $SiO_2$ (silicon oxide).

A lower wire 122 and a fuse 123 are formed on the first interlayer dielectric film 121 at an interval from each other. The lower wire 122 and the fuse 123 are made of Al (aluminum).

When the surface of the semiconductor device 101 is scanned with a laser beam and the position of the alignment mark 106 is recognized, the position (X-, Y- and Z-positions) of the fuse 123 is recognized on the basis of the position of the alignment mark 106. The fuse 123 can be cut by applying a laser beam to the recognized fuse 123. The characteristics (the resistance etc., for example) of the power transistor circuits 104 (see FIG. 12) can be adjusted by whether or not cutting the fuse 123.

A second interlayer dielectric film 124 is stacked on the first interlayer dielectric film 121, the lower wire 122 and the fuse 123. The second interlayer dielectric film 124 is made of $SiO_2$. On the surface of the second interlayer dielectric film 124, a step generally identical in height to the lower wire 122 and the fuse 123 is caused between a portion formed on the first interlayer dielectric film 121 and another portion formed on the lower wire 122 and the fuse 123.

A TEOS (tetraethoxysilane) film 125 is formed on the second interlayer dielectric film 124, to cancel the step caused on the surface of the second interlayer dielectric film 124. The surface of the TEOS film 125 is generally flush with the surface of the portion of the second interlayer dielectric film 124 formed on the lower wire 122 and the fuse 123.

A third interlayer dielectric film 126 is stacked on the second interlayer dielectric film 124 and the TEOS film 125. The third interlayer dielectric film 126 is made of SiN (silicon nitride). An opening 126a is formed in a portion of the third interlayer dielectric film 126 above the fuse 123.

The second interlayer dielectric film 124 and the third interlayer dielectric film 126 are provided with a plurality of via holes 127 passing through the second interlayer dielectric film 124 and the third interlayer dielectric film 126 in the thickness direction, in portions opposed to the lower wire 122 in the thickness direction. The via holes 127 are so tapered that the opening areas thereof are increased upward.

Vias 128 are embedded in the via holes 127, to fill up the via holes 127 so that the upper surfaces thereof are flush with the surface of the third interlayer dielectric film 126. The vias 128 are made of W (tungsten). The diameter of the vias 128 is not more than 1.0 μm, for example.

A barrier film 129 is interposed between the vias 128 and the second and third interlayer dielectric films 124 and 126. The barrier film 129 is made of a material having a barrier property against diffusion of metal atoms, and has a structure obtained by stacking Ti (titanium) and TiN (titanium nitride) in this order, for example.

An upper wire 130 as an uppermost wire and an alignment mark 106 are formed on the third interlayer dielectric film 126 on positions at an interval from each other.

The upper wire 130 is formed on a region including the via holes 127 in plan view, to protrude upward from the third interlayer dielectric film 126. The upper wire 130 has such a thickness that the quantity of protrusion from the surface of the third interlayer dielectric film 126 is 10 μm, for example. The lower surface of the upper wire 130 is planarly formed. The lower end portion of the upper wire 130 is connected with the upper end portions of the vias 128. Thus, the upper wire 130 is electrically connected with the lower wire 122 through the vias 128. The upper wire 130 is made of Cu.

A barrier film 131 having a barrier property against diffusion of Cu ions and Au (gold) is interposed between the upper wire 130 and the third interlayer dielectric film 126. The barrier film 131 is made of Ti.

The surfaces (the upper surface and the side surfaces) of the upper wire 130 are covered with a barrier film 132 having a barrier property against Cu ions and Au. The barrier film 132 is made of Ti.

The surface of the barrier film 132 is covered with a wire covering film 133. The wire covering film 133 and the alignment mark 106 are made of Al.

A passivation film 134 is formed on the third interlayer dielectric film 126 and the wire covering film 133. The passivation film 134 is made of SiN. A pad opening 135 for partially exposing the upper surface of the wire covering film 133 as a pad electrode 105 (see FIG. 13) is formed in a portion of the passivation film 134 formed on the wire covering film 133. The passivation film 134 is partially removed from a portion above the alignment mark 106, a peripheral portion thereof and a portion above the fuse 123, to be provided with openings 134a and 134b.

An end portion of a bonding wire 136 made of Au is bonded to the pad electrode 105 (the portion of the wire covering film 133 exposed from the pad opening 135). The other end portion of the bonding wire 136 is connected to an outer portion of the semiconductor device 101. Thus, the bonding wire 136 is electrically connected with the lower wire 122 through the wire covering film 133, the barrier films 131 and 132 and the upper wire 130.

Figure 14:
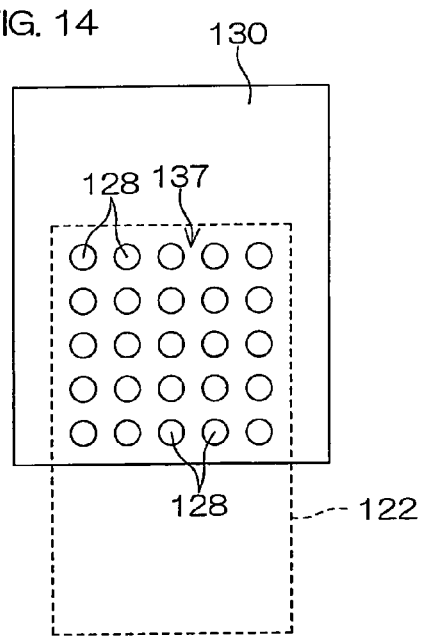
FIG. 14 is a plan view illustratively showing the layout of a lower wire, an upper wire and vias shown in FIG. 13.

FIG. 14 is a plan view illustratively showing the layout of the lower wire 122, the upper wire 130 and the vias 128 shown in FIG. 13. FIG. 14 shows the lower wire 122 with broken lines, in order to facilitate easy understanding of the illustration.

The lower wire 122 and the upper wire 130 are so arranged that parts thereof overlap each other in plan view. The area of an opposed portion 137 of the lower wire 122 and the upper wire 130 is 100 $μm^2$, for example.

The plurality of vias 128 are arranged on the opposed portion 137 in the form of a matrix. More specifically, the plurality of vias 128 are arranged in groups of five vias 128 in directions parallel to the sides of the opposed portion 137 having a square shape in plan view at regular intervals respectively in the third embodiment.

The number of the vias 128 can be arbitrarily changed. For example, the number of the vias 128 can be freely set so that the proportion of the area of the vias 128 (the total area of the plurality of vias 128) to the area of the opposed portion 137 is not less than 0.5% and not more than 30%.

More specifically, when a current flows between the lower wire 122 and the upper wire 130, a voltage drop is caused in the vias 128. The allowance of the quantity of the voltage drop in the vias 128 is 300 mΩ in terms of the resistance, for example. When each via 128 is made of W and has a sectional area of 0.1 µm$^2$ and a length of 0.8 µm, for example, the resistance of the via 128 is about 1.5Ω. If five vias 128 are provided, the voltage drop can be set to 300 mΩ in terms of the resistance. The proportion of the vias 128 is 0.5% in this case.

When the plurality of vias 128 are arranged to be adjacent to one another, an interval of not less than a constant value (not less than 0.3 µm, for example) have to be provided between each pair of the adjacent vias 128. When the maximum number of vias 128 are arranged while ensuring the interval between each pair of the adjacent vias 128, the via proportion is not more than 30%.

FIGS. 15A to 15F are schematic sectional views successively showing the steps of manufacturing the semiconductor device 101 shown in FIG. 13.

In the manufacturing steps for the semiconductor device 101, the first interlayer dielectric film 121 is first stacked on the substrate 120 by CVD (Chemical Vapor Deposition). Thereafter an Al film for serving as the material for the lower wire 122 and the fuse 123 is formed on the first interlayer dielectric film 121 by sputtering. Then, the Al film is patterned by photolithography and etching, thereby forming the lower wire 122 and the fuse 123.

Then, the second interlayer dielectric film 124 is formed on the first interlayer dielectric film 121, the lower wire 122 and the fuse 123 by HDP (High Density Plasma)-CVD. Thereafter the TEOS film 125 is formed on the second interlayer dielectric film 124 by CVD. Then, the TEOS film 125 is polished from the surface thereof by CMP (Chemical Mechanical Polishing). The TEOS film 125 is polished until the surface of the TEOS film 125 and the surface of the portion of the second interlayer dielectric film 124 formed on the lower wire 122 and the fuse 123 are flush with each other.

Figure 15A:
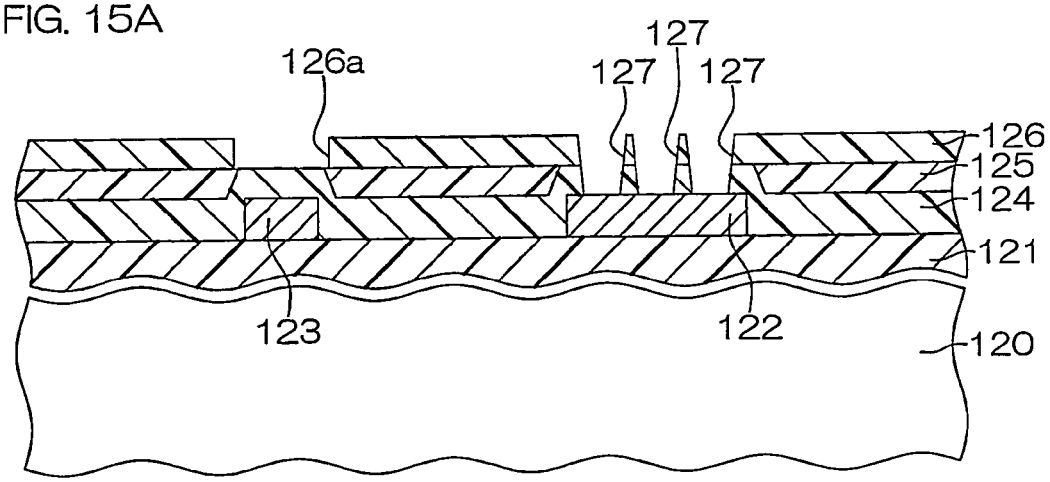
FIGS. 15A to 15F are schematic sectional views successively showing the steps of manufacturing the semiconductor device shown in FIG. 13.

Then, the third interlayer dielectric film 126 is formed on the second interlayer dielectric film 124 and the TEOS film 125 by plasma CVD. Thereafter the second interlayer dielectric film 124 and the third interlayer dielectric film 126 are selectively removed by photolithography and etching as shown in FIG. 15A, to form the plurality of via holes 127 passing through the second and third interlayer dielectric films 124 and 126 in the thickness direction. In the region above the fuse 123, the third interlayer dielectric film 126 is selectively removed, to form the opening 126a passing through the third interlayer dielectric film 126.

Figure 15B:
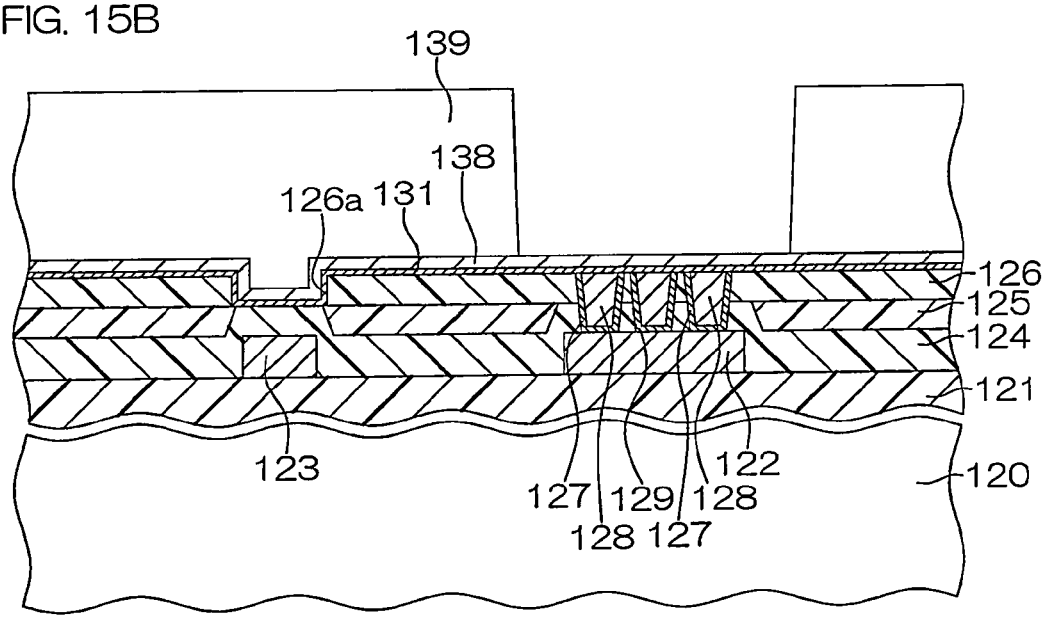

Then, the barrier film 129 is applied to the inner surfaces of the via holes 127 by sputtering, as shown in FIG. 15B. Then, the vias 128 are formed on the barrier film 129 in the via holes 127 by W-CVD (plasma CVD employing WF$_6$ (tungsten hexafluoride) gas as source gas). Thereafter the vias 128 are polished from the surfaces thereof, so that the surfaces of the vias 128 are flush with the surface of the third interlayer dielectric film 126. Then, the barrier film 131 is formed on the third interlayer dielectric film 126 by sputtering. Then, a seed film 138 made of Cu is formed on the barrier film 131 by sputtering. Thereafter a resist pattern 139 having an opening in a portion opposed to the region including the via holes 127 in plan view is formed on the barrier film 131 and the seed film 138.

Figure 15C:
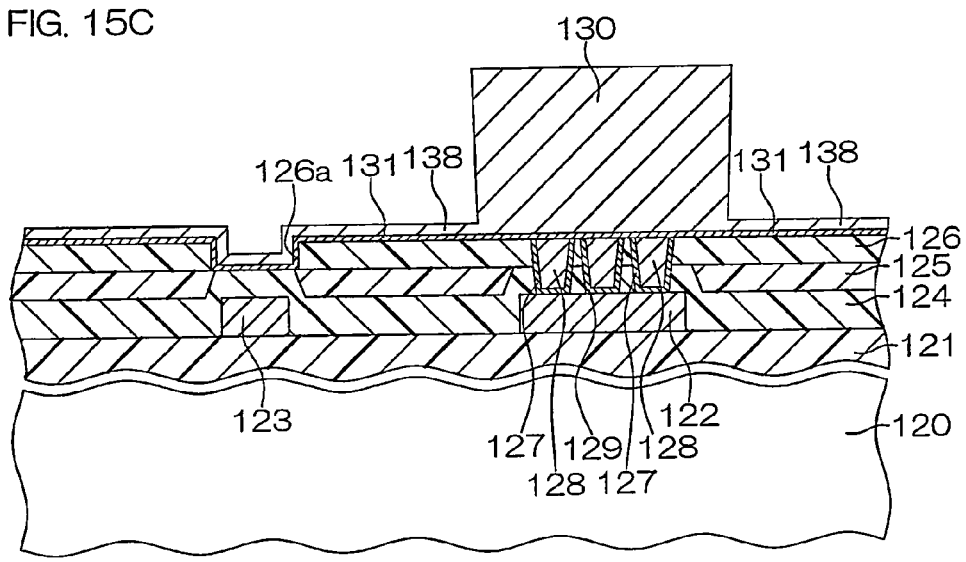

Then, Cu is grown by plating in the opening of the resist pattern 139. Thus, the opening of the resist pattern 139 is filled up with Cu to form the upper wire 130 made of Cu, as shown in FIG. 15C. After the formation of the upper wire 130, the resist pattern 139 is removed.

Figure 15D:
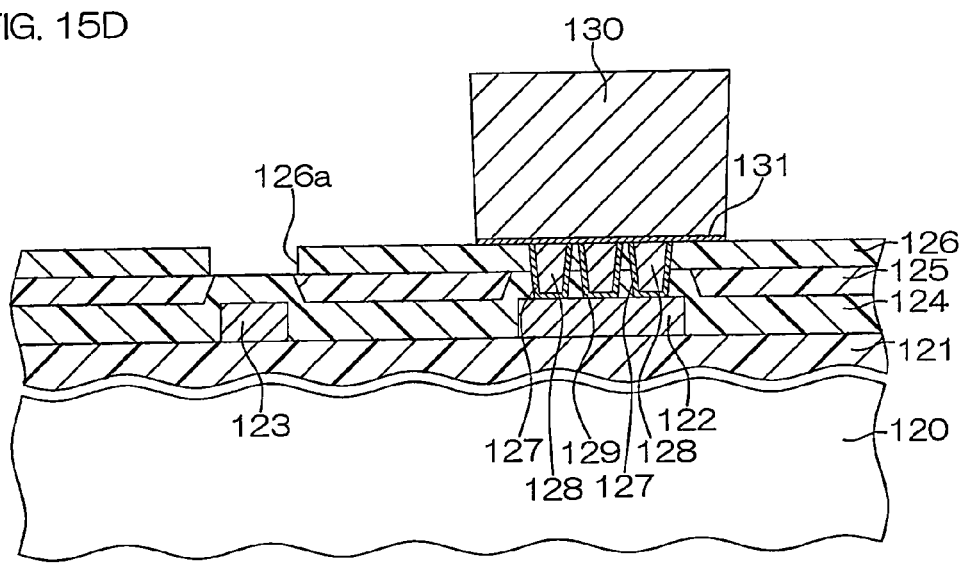

Thereafter portions of the barrier film 131 and the seed film 138 having been formed under the resist pattern 139 are removed by etching, as shown in FIG. 15D.

Figure 15E:
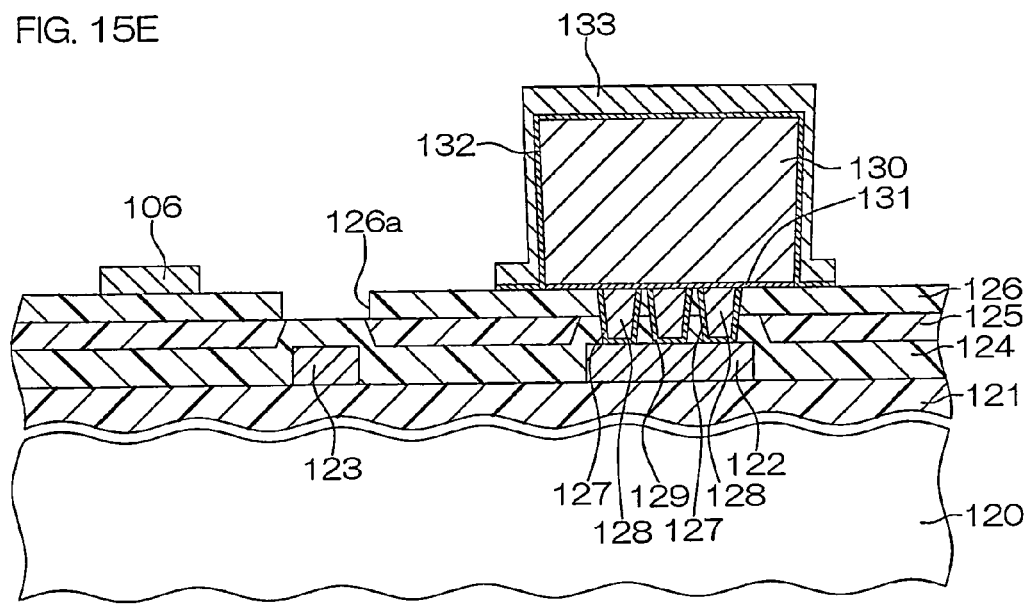

Then, a Ti film and an Al film are formed in this order on the third interlayer dielectric film 126 and the upper wire 130 by sputtering. Then, the Ti film and the Al film are selectively removed by photolithography and dry etching (RIE, for example), to form the wire covering film 133, the barrier film 132 and the alignment mark 106, as shown in FIG. 15E.

Figure 15F:
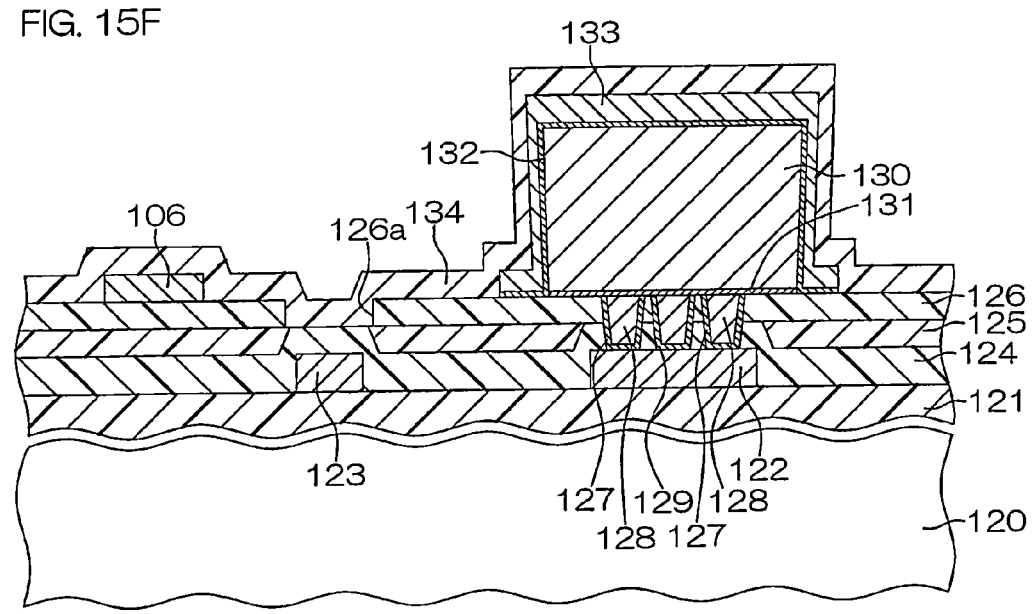

Thereafter the passivation film 134 is formed on the third interlayer dielectric film 126, the wire covering film 133 and the alignment mark 106 by CVD, as shown in FIG. 15F.

Then, the pad opening 135 is formed in the passivation film 134 by photolithography and etching, and the passivation film 134 is partially removed from a portion above the alignment mark 106, the peripheral portion thereof and the portion above the fuse 123, to form the openings 134a and 134b. Then, the end portion of the bonding wire 136 is bonded to the portion of the upper wire 130 (the wire covering film 133) exposed from the pad opening 135, to obtain the semiconductor device 101 shown in FIGS. 12, 13 and 14.

In the semiconductor device 101, as hereinabove described, the third interlayer dielectric film 126 is formed on the lower wire 122. The upper wire 130 made of Cu is formed on the surface of the third interlayer dielectric film 126. The upper wire 130 and the lower wire 122 are electrically connected with each other by the plurality of vias 128 passing through the third interlayer dielectric film 126 in the thickness direction.

The upper wire 130 and the lower wire 122 are electrically connected with each other by the plurality of vias 128, whereby the size of each via 128 can be reduced without increasing connection resistance between the upper wire 130 and the lower wire 122, as compared with a structure in which the upper wire 130 and the lower wire 122 are connected with each other by only one via 128. When the size of each via 128 is reduced, the size of the via hole 127 for embedding each via 128 therein is reduced accordingly. Therefore, the barrier film 129 can be formed on the bottom surfaces and the side surfaces, including corner portions formed by the bottom surfaces and the side surfaces, of the via holes 127 with a generally uniform thickness.

Further, the vias 128 are made of W, whereby no Cu diffuses from the vias 128 into the third intermediate dielectric film 126. Therefore, no barrier film may be provided between the vias 128 and the third interlayer dielectric film 126.

Thus, the upper wire 130 made of Cu and the lower wire 122 can be electrically connected with each other, while excellently preventing diffusion of Cu into the third interlayer dielectric film 126.

Further, the vias 128 are so reduced in size that the vias 28 can be formed in the same step as vias in other portions of the semiconductor device 101. Thus, the manufacturing steps for the semiconductor device 101 can be simplified.

The surfaces of the vias 128 and the surface of the third interlayer dielectric film 126 are flush with one another. Thus, the barrier film 131 can be formed with a constant thickness. Therefore, the barrier film 131 is not partially reduced in thickness, but can excellently prevent diffusion of Cu from the upper wire 130 into the third interlayer dielectric film 126.

Figure 18:
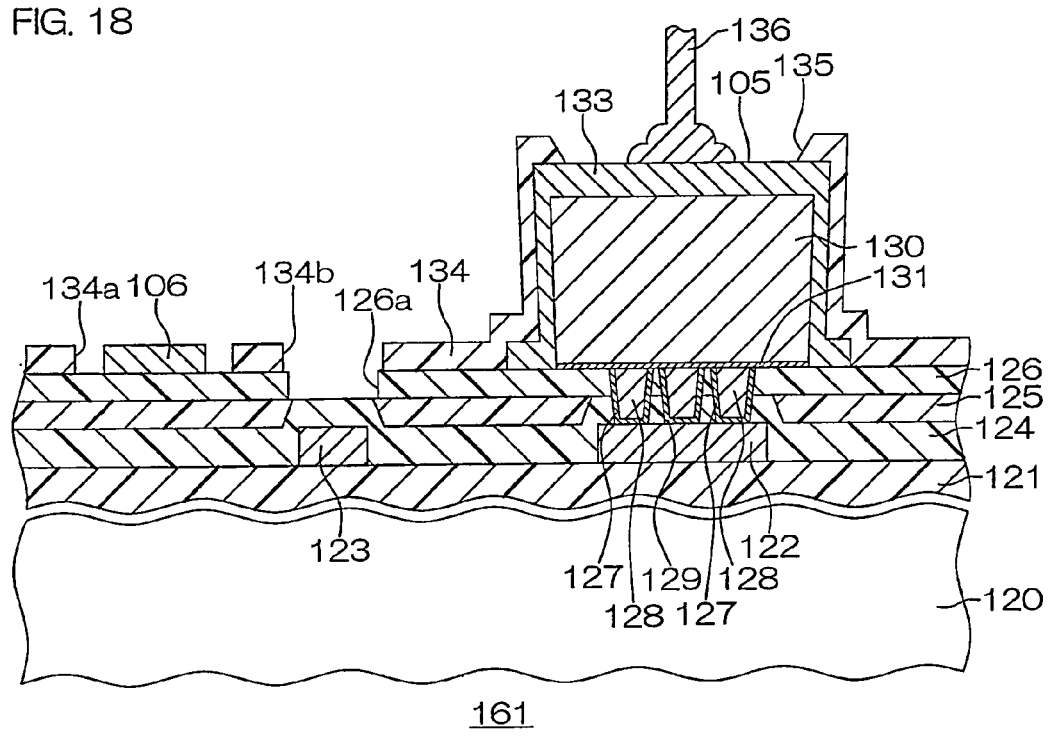
FIG. 18 is a schematic sectional view showing a third modification of the semiconductor device shown in FIG. 13.

FIG. 16 is a schematic sectional view of a semiconductor device according to a first modification of the third embodiment. Referring to FIGS. 16 to 18, portions corresponding to those shown in FIG. 13 are denoted by the same reference numerals respectively. In the following, redundant description is omitted as to the portions denoted by the same reference numerals.

In a semiconductor device 141 according to the first modification, a passivation film 142 having a multilayer structure of a nitride film 143 and an organic film 144 is provided on a third interlayer dielectric film 126 and a wire covering film 133.

The nitride film 143 is made of SiN. The nitride film 143 is formed on the third interlayer dielectric film 126 and the wire covering film 133. In a portion of the nitride film 143 formed on the wire covering film 133, a pad opening 145 for partially exposing the upper surface of the wire covering film 133 as a pad electrode 105 is formed to pass through the nitride film 143 in the thickness direction. The nitride film 143 is partially removed from a portion above an alignment mark 106, a peripheral portion thereof and a portion above a fuse 123.

An upper wire 130 is formed to protrude on the third interlayer dielectric film 126, and hence a step generally equal in thickness to the upper wire 130 and the wire covering film 133 is caused on the surface of the nitride film 143 between a portion formed on the wire covering film 133 covering the upper wire 130 and another portion formed on the third interlayer dielectric film 126.

The organic film 144 is formed to cancel the step caused on the surface of the nitride film 143. The organic film 144 is made of an organic material (polyimide or epoxy resin, for example). The organic film 144 is provided with an opening 146 communicating with the pad opening 145 in a region including the portion provided with the pad opening 145 in plan view. Further, the organic film 144 is partially removed from the portion above the alignment mark 106, the peripheral portion thereof and the portion above the fuse 123.

Also according to this structure, advantages similar to those of the semiconductor device 101 shown in FIG. 13 can be attained.

Further, the organic film 144 is formed on the nitride film 133 to fill up the step on the surface of the nitride film 143. When stress is applied to the upper wire 130 (the wire covering film 133), therefore, the organic film 144 can absorb the stress.

In addition, the passivation film 142 has the multilayer structure of the nitride film 143 and the organic film 144. Even if the organic film 144 is damaged by a filler contained in the material for a resin package to seal the semiconductor device 141, therefore, the nitride film 143 is not damaged, but can ensure the function (prevention of infiltration of moisture etc.) of the passivation film. Thus, the reliability of the semiconductor device 141 can be improved.

FIG. 17 is a schematic sectional view of a semiconductor device according to a second modification of the third embodiment.

A semiconductor device 151 includes a passivation film 152 on a third interlayer dielectric film 126 and a wire covering film 133. The passivation film 152 is an organic film made of an organic material such as polyimide or epoxy resin, for example.

An upper wire 130 is formed to protrude on the third interlayer dielectric film 126, and hence a step generally equal in thickness to the upper wire 130 and the wire covering film 133 is caused between the surface of the wire covering film 133 covering the upper wire 130 and the surface of the third interlayer dielectric film 126.

The passivation film 152 is formed on the third interlayer dielectric film 126 and the wire covering film 133, to cancel the step caused between the surface of the wire covering film 133 and the surface of the third interlayer dielectric film 126.

In a portion of the passivation film 152 formed on the wire covering film 133, a pad opening 153 for partially exposing the upper surface of the wire covering film 133 as a pad electrode 105 is formed to pass through the passivation film 152 in the thickness direction. The passivation film 152 is partially removed from a portion above an alignment mark 106, a peripheral portion thereof and a portion above a fuse 123.

Also according to this structure, advantages similar to those of the semiconductor device 101 shown in FIG. 13 can be attained. Further, the passivation film 152 fills up the step between the surface of the wire covering film 133 and the surface of the upper wire 130. When stress is applied to the upper wire 130 (the wire covering film 133), therefore, the passivation film 152 can absorb the stress.

FIG. 18 is a schematic sectional view of a semiconductor device according to a third modification of the third embodiment.

In a semiconductor device 161 shown in FIG. 18, no barrier film 132 is interposed between an upper wire 130 and a wire covering film 133, while a bonding wire 135 is made of copper.

When the bonding wire 135 is made of copper, no defect (electromigration) is caused between the bonding wire 135 and the upper wire 130 by migration of metallic ions, whereby the barrier film 132 shown in FIG. 13 can be omitted. Thus, the manufacturing cost for the semiconductor device 161 can be reduced.

Further modifications of the third embodiment are as follows:

For example, while the semiconductor device 101 shown in FIG. 13 is provided with the plurality of vias 128, the semiconductor device 101 may alternatively be provided with only one via 128, if the via 128 is made of W.

When the via 128 is made of W, no barrier film for preventing diffusion of Cu may be provided in an opening (a via hole) formed for embedding the via 128 therein, even if the opening has a large size. Therefore, diffusion of Cu from the via 128 into the third interlayer dielectric film 126 can be reliably prevented, despite the large-sized opening.

While W is employed as the material for the vias 128, a material mainly composed of Cu may alternatively be employed as the material for the vias 128. In this case, a step of forming the vias 128 may be omitted, and the upper wire 130 and the vias 128 can be collectively formed in a plating step for forming the upper wire 130. However, W has lower diffusibility into an insulating material than Cu, and hence formation of a leakage path can be reliably prevented by employing W as the material for the vias 128.

For example, while SiN is illustrated as the material for the third interlayer dielectric film 126, $SiO_2$ may alternatively be employed as the material for the third interlayer dielectric film 126. However, Cu ions more easily diffuse in $SiO_2$ than in SiN, and hence diffusion of Cu ions can be more excellently prevented by employing SiN as the material for the third interlayer dielectric film 126.

While Ti is illustrated as the material for the barrier films 131 and 132, the barrier films 131 and 132 need to simply be made of a material having conductivity and a barrier property against diffusion of Cu ions and Au. Examples of such a material include TiN (titanium nitride), WN (tungsten nitride), TaN (tantalum nitride), Ta (tantalum), W (tungsten) and TiW (a titanium-tungsten alloy), in addition to titanium. Single films of any of these materials may be employed as the barrier films 131 and 132, or the barrier films 131 and 132 may be formed by multilayer films made of two or more types of materials arbitrarily selected from these materials.

While Al is illustrated as the material for the wire covering film 133, the wire covering film 133 needs to simply be made of a metallic material having high adhesiveness to Cu and the insulating material. Examples of such a material include AlSi (a silicon compound of aluminum), AlSiCu (a silicon compound of an aluminum-copper alloy) and AlCu (an aluminum-copper alloy), in addition to Al.

While polyimide or epoxy resin is illustrated as the material for the organic film 134 and the passivation film 142, the organic film 134 and the passivation film 142 may alternatively be made of PBO (polyparaphenylene benzobisoxazole) or BCB (benzocyclobutene), for example.

Other characteristics of the semiconductor devices according to the aforementioned first to third embodiments are now described with reference to FIGS. 19 to 25.

Figure 19:
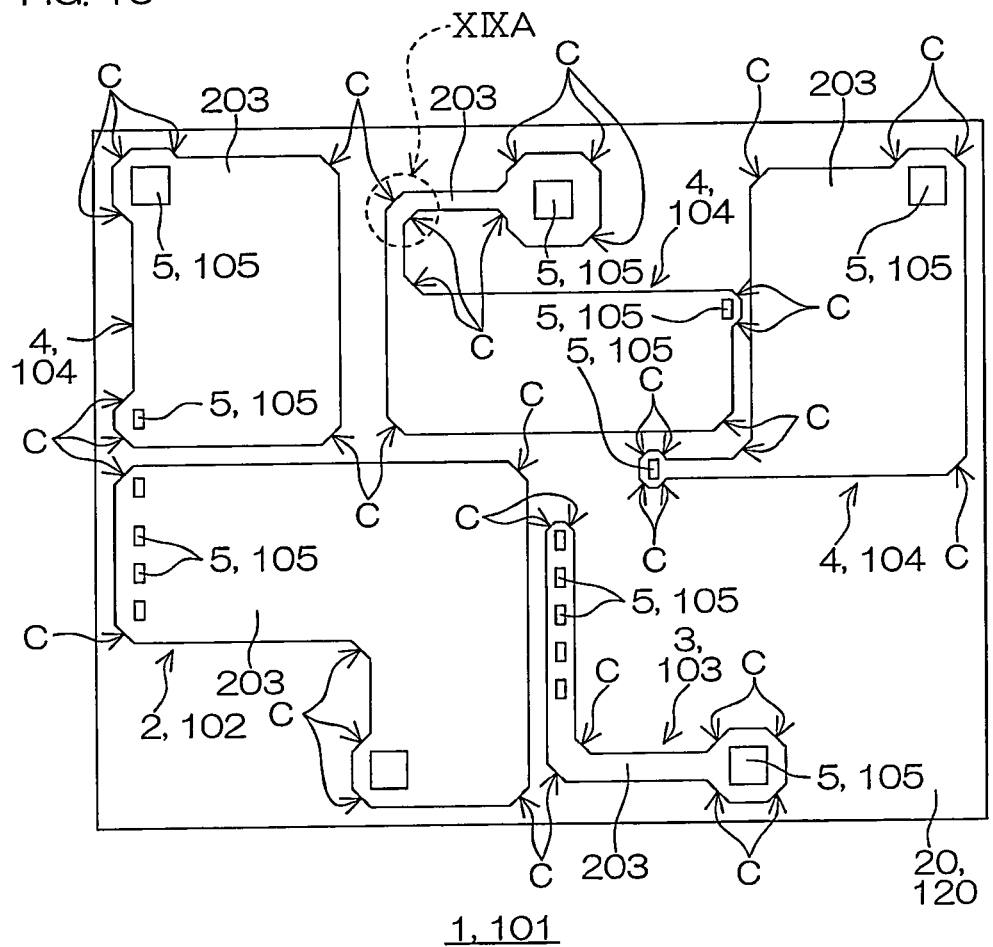
FIG. 19 is an illustrative plan view reshowing the plan view of FIG. 1 or 12 in a vertically inverted manner for the convenience of illustration.

FIG. 19 is an illustrative plan view reshowing the plan view of FIG. 1 or 12 in a vertically inverted manner for the convenience of illustration, along with the reference numerals shown in FIG. 1 or 12.

Wires 203 having a prescribed wire pattern are formed on the semiconductor substrate 20 or 120. The wires 203 are included in the circuits 2, 3 and 4 formed on the semiconductor substrate 20 or 120.

FIG. 19A is an illustrative plan view showing the wire 203 in a portion XIXA in FIG. 19 in an enlarged manner.

The wire 203 has a width of not less than 10 µm, for example, and includes a first wire portion 204, a second wire portion 205 and a connecting wire portion 206.

The first wire portion 204 extends in a first direction X parallel to one side of the semiconductor substrate 20 or 120.

The second wire portion 205 extends in a second direction Y orthogonal to the first direction X.

The connecting wire portion 206 extends in a direction intersecting with the first direction X and the second direction Y, and is connected to an end portion of the first wire portion 204 and an end portion of the second wire portion 205. Thus, the first wire portion 204 and the second wire portion 205 are connected with each other through the connecting wire portion 206.

The inner side surface of the connecting wire portion 206 forms a straight line L connecting a junction A between the first wire portion 204 and the connecting wire portion 206 and a junction B between the second wire portion 205 and the connecting wire portion 206 with each other. Similarly, the outer side surface of the connecting wire portion 206 forms a straight line L1 connecting a junction A1 between the first wire potion 204 and the connecting wire portion 206 and a junction B1 between the second wire portion 205 and the connecting wire portion 206 with each other.

The dimension D1 of the straight line L on the inner side surface in the first direction X is 1 µm, for example. The dimension D2 of the straight line L in the second direction Y is 1 µm, for example. Also as to the straight line L1 on the outer side surface, the dimensions in the first direction X and the second direction Y are preferably not less than 1 µm, and both dimensions are greater than 1 µm in the example shown in FIG. 19A.

Figure 20:
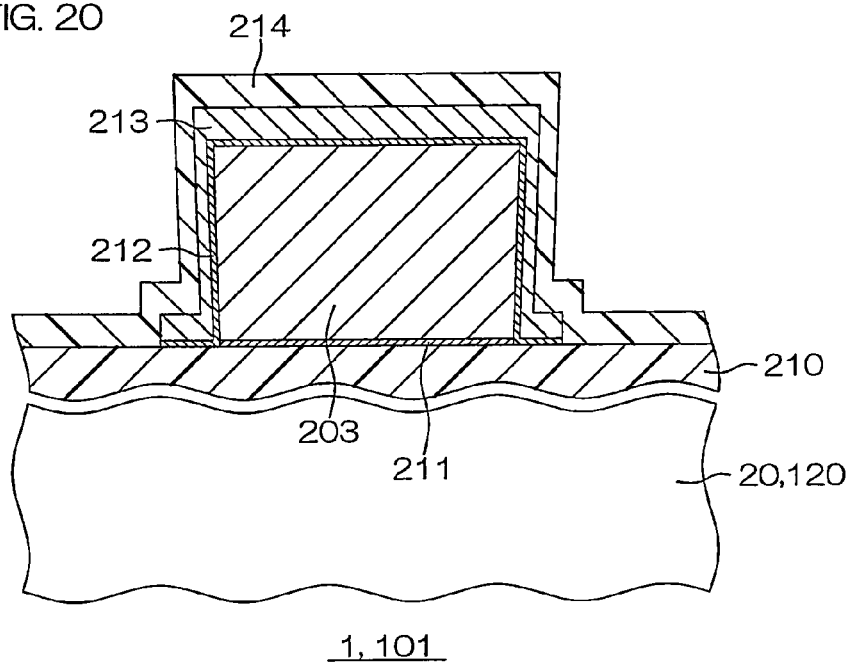
FIG. 20 is a sectional view of the semiconductor device taken along a line XX-XX in FIG. 19A.

FIG. 20 is a schematic sectional view of the semiconductor device 1 or 101 taken along a line XX-XX in FIG. 19A.

As shown in FIG. 20, the semiconductor device 1 or 101 includes the substrate 20 or 120 made of Si (silicon) as the base thereof. An interlayer dielectric film 210 (corresponding to the interlayer dielectric films 21, 24, 25 and 26 or 121, 124, 125 and 126) is stacked on the substrate 20 or 120. The interlayer dielectric film 210 is made of $SiO_2$ (silicon oxide). The thickness of the interlayer dielectric film 210 is 2.5 µm, for example.

A wire 203 (corresponding to the upper wire 28 or 130) is formed on the interlayer dielectric film 210, to protrude upward from the interlayer dielectric film 210. The wire 203 has such a thickness that the quantity of protrusion from the surface of the interlayer dielectric film 210 is 10 µm, for example. The wire 203 is made of Cu.

A barrier film 211 (a second barrier film, corresponding to the barrier film 27 or 131) having a barrier property against diffusion of Cu ions is interposed between the wire 203 and the interlayer dielectric film 210. The barrier film 211 is made of Ti (titanium).

The surfaces (the upper surface and the side surfaces) of the wire 203 are covered with a barrier film 212 (a first barrier film, corresponding to the barrier film 32 or 132) having a barrier property against diffusion of Cu ions. The barrier film 212 is made of Ti.

The surface of the barrier film 212 is covered with a wire covering film 213 (corresponding to the wire covering film 31 or 133). The wire covering film 213 is made of Al.

A passivation film 214 (corresponding to the passivation film 33 or 134) is formed on the interlayer dielectric film 210 and the wire covering film 213. The passivation film 214 is made of SiN.

<Simulation>

The inventors have conducted a simulation for investigating the relation between the dimensions D1 and D2 and the width of the wire 203 and maximum stress caused on corner portions of the wire 203.

In the simulation, the dimensions D1 and D2 shown in FIG. 19A were set to 10 µm, 5 µm, 2.5 µm, 1 µm and 0 µm as to wires 203 having widths of 50 µm, 20 µm and 10 µm respectively, to check stress applied to corner portions of the wires 203.

Table 1 shows the results of the simulation.

TABLE 1

| D1:D2 (µm) | Stress (MPa) | | |
|---|---|---|---|
| | Width of Wire: 50 µm | Width of Wire: 20 µm | Width of Wire: 10 µm |
| 10 | 407.142 | 397.465 | 360.817 |
| 5 | 398.913 | 389.738 | 346.444 |
| 2.5 | 395.822 | 387.034 | 340.862 |
| 1 | 413.658 | 405.336 | 354.274 |
| 0 | 553.556 | 544.055 | 456.864 |

Figure 21:
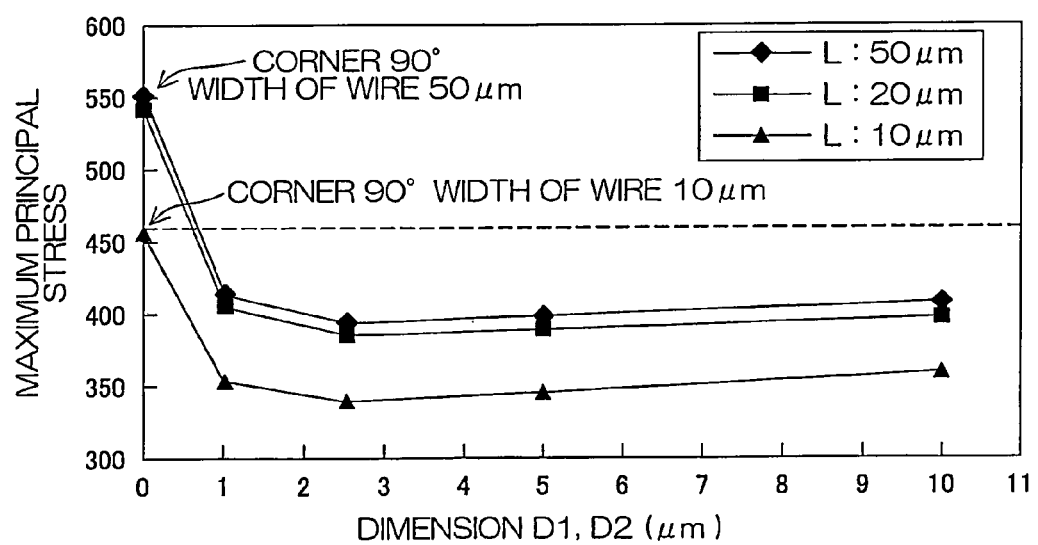
FIG. 21 is a line graph of maximum stress.

FIG. 21 is a line graph of maximum stress shown in Table 1.

Referring to FIG. 21, the axis of abscissas shows the dimensions D1 and D2 (µm), and the axis of ordinates shows the maximum stress (MPa).

As shown in Table 1 and FIG. 21, the stress applied to the corner portions of the wires 203 is remarkably reduced when the dimensions D1 and D2 are not less than 1 µm as compared with the case where the dimensions D1 and D2 are 0 µm, regardless of the widths of the wires 203.

Figure 22:
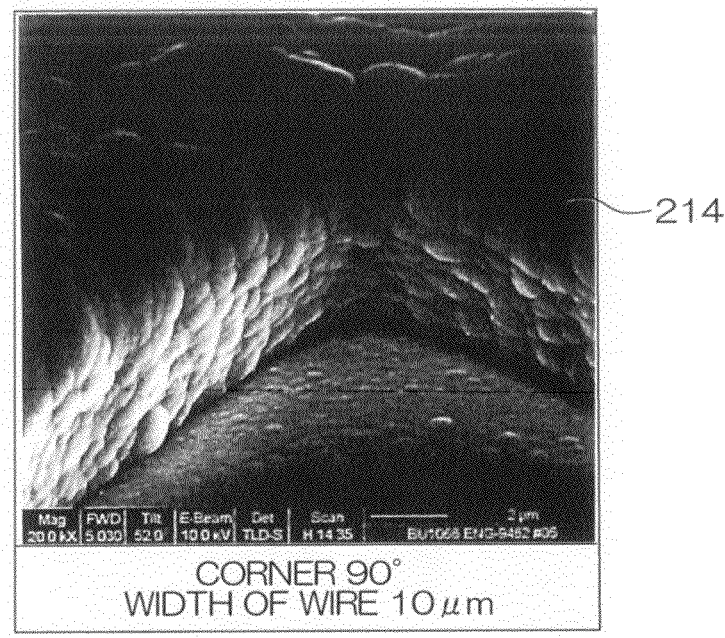
FIG. 22 is an SEM photograph of a portion around a corner of a wire having a width of 10 μm and dimensions D1 and D2 of 0 μm.
Figure 23:
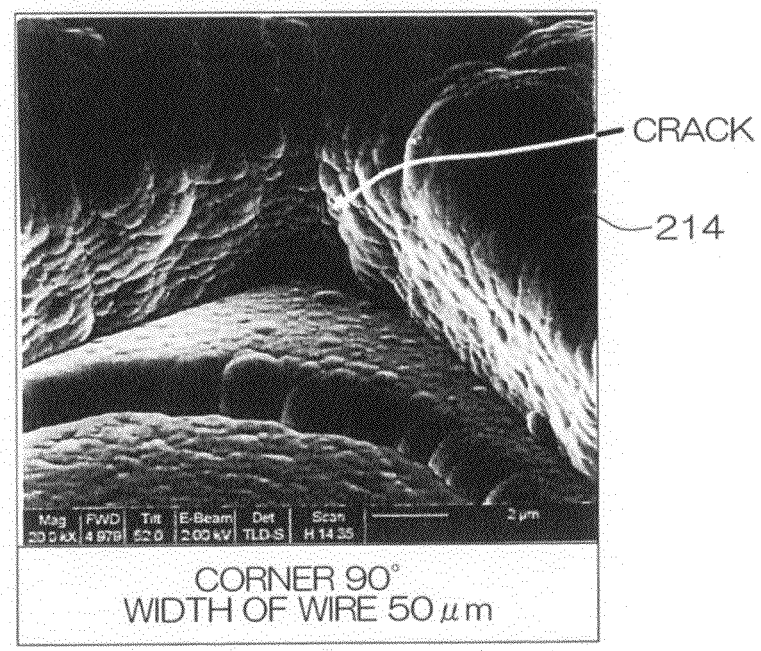
FIG. 23 is an SEM photograph of a portion around a corner of a wire having a width of 50 μm and dimensions D1 and D2 of 0 μm.

FIG. 22 is an SEM photograph of a portion around a corner of the wire having the width of 10 µm and the dimensions D1 and D2 of 0 µm. FIG. 23 is an SEM photograph of a portion around a corner of the wire having the width of 50 µm and the dimensions D1 and D2 of 0 µm.

As shown in FIG. 22, the passivation film 214 covering the surface of the wire 203 is not cracked when the wire 203 has the width of 10 µm and the dimensions D1 and D2 of 0 µm. In this case, the maximum stress applied to the corner portion of the wire 203 is 456.864 MPa, as shown in Table 1.

As shown in FIG. 23, the passivation film 214 covering the surface of the wire 203 is cracked when the wire 203 has the width of 50 µm and the dimensions D1 and D2 of 0 µm. In this case, the maximum stress applied to the corner portion of the wire 203 is 553.556 MPa, as shown in Table 1.

If the maximum stress applied to the corner portion of the wire 203 is not more than 456.864 MPa, therefore, it can be inferred that the passivation film 214 covering the corner portion is not cracked, as shown by the broken line in FIG. 21. If the dimensions D1 and D2 are not less than 1 µm, the stress applied to the corner portion of the wire 203 can be reduced to not more than 456.864 MPa, regardless of the width of the wire 203. Therefore, the dimensions D1 and D2 are set to not less than 1 µm.

As hereinabove described, the connecting wire portion 206 is provided between the first wire portion 204 and the second wire portion 205, whereby at least two corner portions are formed on the side surfaces of the wire 203 between the first wire portion 204 and the connecting wire potion 206 and between the second wire portion 205 and the connecting wire portion 206. If stress is applied to the passivation film 214 covering the surface of the wire 203, therefore, the stress can be dispersed to the plurality of corner portions, whereby stress concentration on the passivation film 214 can be suppressed. Further, the plurality of corner portions formed on the inner side surface and the outer side surface of the wire 203 are at angles greater than a right angle (i.e. obtuse angles), whereby stress concentration on the passivation film 214 can be effectively suppressed.

When the wire 203 has a width of not less than 10 µm, the stress applied to the passivation film 214 is increased, to increase the probability of cracking of the passivation film 214. Also in this case, stress concentration on the passivation film 214 can be suppressed by setting the dimensions D1 and D2 of the straight line L, connecting the junction A between the first wire portion 204 and the connecting wire portion 206 and the junction B between the second wire portion 205 and the connecting wire portion 206 with each other, in the first and second directions X and Y to not less than 1 µm respectively, and cracking resulting from stress concentration on the passivation film 214 can be prevented. According to this embodiment, the wires 203 formed on the semiconductor substrate 20 or 120 have no right-angled corner portions, as shown by reference signs C in FIG. 19. In other words, two corner portions (corner portions both forming obtuse-angled side surfaces in plan view) are formed on a portion coupling two orthogonal sides of each wire 203 with each other. Thus, stress concentration on the passivation film 214 is suppressed.

Figure 24:
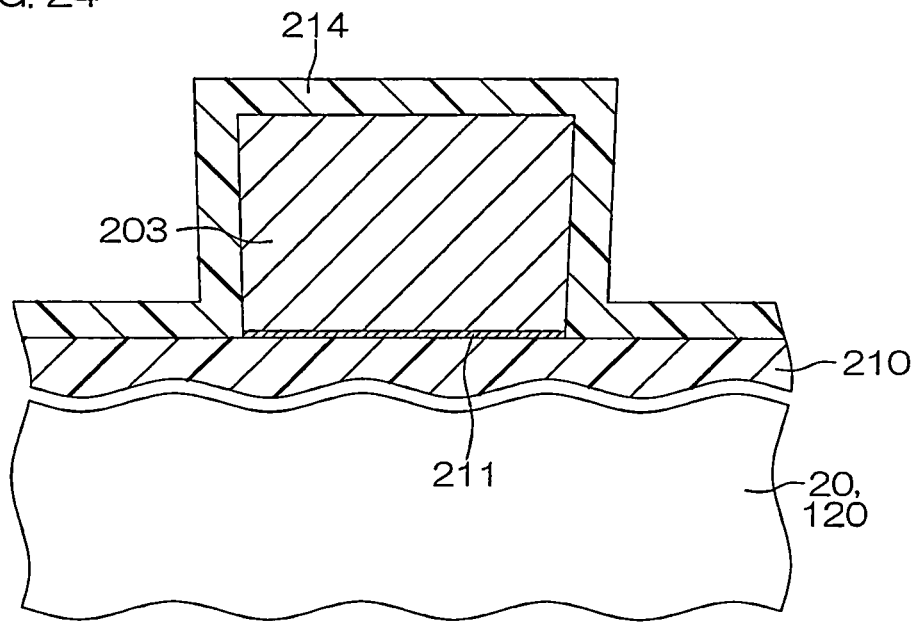
FIG. 24 is a schematic sectional view showing a modification of the wire.

FIG. 24 is a schematic sectional view showing another structure of the wire 203.

Referring to FIG. 24, portions corresponding to those shown in FIG. 20 are denoted by the same reference numerals respectively. In the following, redundant description is omitted as to the portions denoted by the same reference numerals.

In the structure shown in FIG. 24, the barrier film 212 and the wire covering film 213 are omitted. Also according to this structure, advantages similar to those of the semiconductor device 1 or 101 shown in FIG. 20 can be attained. However, the wire covering film 213 has high adhesiveness to Cu employed as the material for the wire 203 and SiN employed as the material for the passivation film 214, and hence the adhesiveness of the passivation film 214 to the wire 203 can be improved when the wire covering film 213 is provided.

Figure 25:
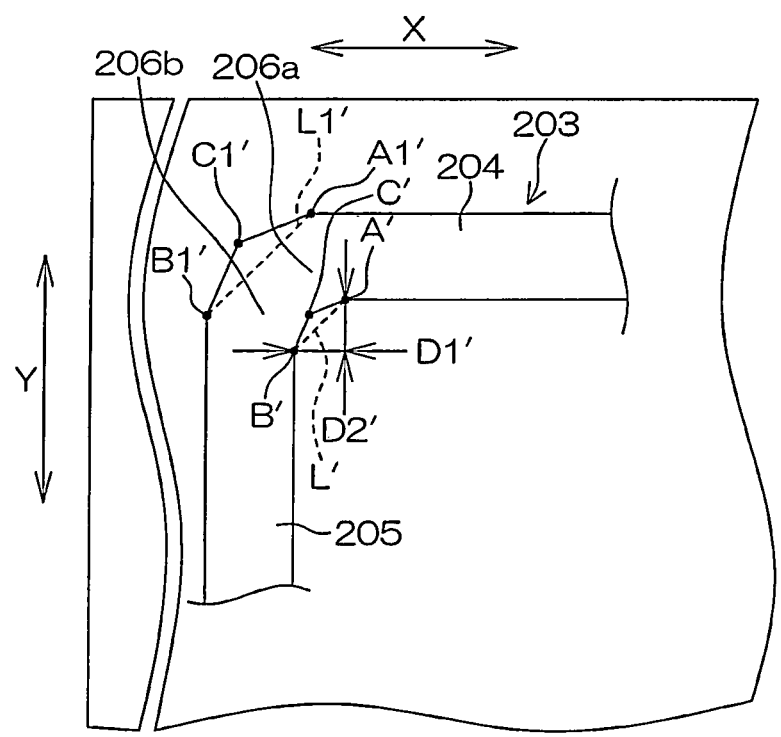
FIG. 25 is an illustrative plan view showing another modification of the wire.

FIG. 25 is an illustrative plan view showing still another structure of the wire 203.

Referring to FIG. 25, portions corresponding to those shown in FIG. 19A are denoted by the same reference numerals respectively. In the following, redundant description is omitted as to the portions denoted by the same reference numerals.

In the structure shown in FIG. 25, the wire 203 includes a first connecting wire portion 206a and a second wire portion 206b between the first wire portion 204 and the second wire portion 205. In this embodiment, the lengths of the first and second wire portions 206a and 206b are generally equal to each other.

An end portion of the first connecting wire portion 206a is connected to the end portion of the first wire portion 204.

An end portion of the second connecting wire portion 206b is connected to the end portion of the second wire portion 205.

The other end portions of the first connecting wire portion 206a and the second connecting wire portion 206b are connected with each other. Thus, the first wire portion 204 and the second wire portion 205 are connected with each other through the first connecting wire portion 206a and the second connecting wire portion 206b. The inner side surfaces of the first and second connecting wire portions 206a and 206b form bent lines connecting a junction A' between the first wire portion 204 and the first connecting wire portion 206a, a junction C' between the first and second connecting wire portions 206a and 206b and a junction B' between the second wire portion 205 and the second connecting wire portion 206b with one another. Similarly, the outer side surfaces of the first and second connecting wire portions 206a and 206b form bent lines connecting a junction A1' between the first wire portion 204 and the first connecting wire portion 206a, a junction C1' between the first and second connecting wire potions 206a and 206b and a junction B1' between the second wire portion 205 and the connecting wire portion 206b with one another. Corner portions forming obtuse angles in plan view are formed on the junctions A', B', C', A1', B1' and C1' respectively.

A straight line L' connecting the junction A' between the first wire portion 204 and the first connecting wire portion 206a and the junction B' between the second wire portion 205 and the second connecting wire portion 206b with each other on the inner side surface of the wire 203 has a dimension D1' of 1 µm, for example, in a direction X. Further, the straight line L' has a dimension D2' of 1 µm, for example, in a direction Y. A straight line L1' connecting the junction A1' between the first wire portion 204 and the first connecting wire portion 206a and the junction B1' between the second wire portion 205 and the connecting wire portion 206b with each other on the outer side surface of the wire 203 has a dimension of not less than 1 µm (greater than 1 µm in the example shown in FIG. 25) in the direction X. Further, the straight line L1' has a dimension of not less than 1 µm (greater than 1 µm in the example shown in FIG. 25) in the direction Y, for example.

Also according to this structure, advantages similar to those of the semiconductor device 1 or 101 shown in FIG. 19A can be attained.

A large number, not less than three, of connecting wire portions may alternatively be provided between the first wire portion 204 and the second wire portion 205. The number of the corner portions formed on the side surfaces of the wire 203 is increased in proportion to the number of the connecting wire portions, whereby stress concentrated on the corner portions of the wire 203 can be reduced.

When the wire 203 is provided with a large number of connecting wire portions, pseudo-curves (curved surfaces)

constituted of a large number of straight lines (planes) are formed on the inner side surface and the outer side surface of the wire 203. A large number of corner portions are formed on the inner side surface and the outer side surface of the wire 203 and stress is uniformly dispersed on the corner portions, whereby the wire 203 can be more effectively prevented from local stress concentration.

While Ti is illustrated as the material for the barrier films 211 and 212, the barrier films 211 and 212 need to simply be made of a material having conductivity and a barrier property against diffusion of Cu ions and Au. Examples of such a material include TiN (titanium nitride), WN (tungsten nitride), TaN (tantalum nitride), Ta (tantalum), W (tungsten) and TiW (a titanium-tungsten alloy), in addition to Ti. Single films of any of these materials may be employed as the barrier films 211 and 212, or the barrier films 211 and 212 may be formed by multilayer films made of two or more types of materials arbitrarily selected from these materials.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application Nos. 2010-007094, 2010-007095 and 2010-007096 filed with the Japan Patent Office on Jan. 15, 2010, and Japanese Patent Application No. 2010-068051 filed with the Japan Patent Office on Mar. 24, 2010, the disclosures of which are incorporated herein by reference.

What is claimed is:

1. A semiconductor device comprising:
an interlayer dielectric film;
a passivation film, made of an insulating material, formed on the interlayer dielectric film;
an uppermost wire, made of a material mainly composed of copper, formed between a surface of the interlayer dielectric film and the passivation film; and
a wire covering film, made of a material mainly composed of aluminum, interposed between the passivation film and a surface of the uppermost wire, the wire covering film covering the surface of the uppermost wire;
wherein the wire covering film extends in both a horizontal direction along an upper surface of the uppermost wire and a perpendicular direction along a side surface of the uppermost wire, the wire covering film covering the uppermost wire.

2. The semiconductor device according to claim 1, further comprising a first barrier film, made of a material having a barrier property against diffusion of copper, interposed between the surface of the uppermost wire and the wire covering film.

3. The semiconductor device according to claim 2, wherein the first barrier film has a barrier property against diffusion of gold.

4. The semiconductor device according to claim 2, wherein the first barrier film is formed by a single film or a multilayer film made of one or more materials selected from a group consisting of Ti, TiN, WN, TaN, Ta, W and TiW.

5. The semiconductor device according to claim 1, wherein a second barrier film having a barrier property against diffusion of copper is interposed between the uppermost wire and the interlayer dielectric film.

6. The semiconductor device according to claim 5, wherein the second barrier film is formed by a single film or a multilayer film made of one or more materials selected from a group consisting of Ti, TiN, WN, TaN, Ta, W and TiW.

7. The semiconductor device according to claim 1, wherein the passivation film is provided with a pad opening selectively exposing a surface of the wire covering film,
the semiconductor device further comprises a bonding wire, made of copper, bonded to a portion of the wire covering film exposed from the pad opening, and
the wire covering film is in close contact with the uppermost wire.

8. The semiconductor device according to claim 1, wherein the passivation film is made of silicon nitride.

9. The semiconductor device according to claim 1, wherein the passivation film includes a nitride film made of silicon nitride and an organic film, made of an organic material, formed on the nitride film.

10. The semiconductor device according to claim 1, wherein the passivation film is made of an organic material.

11. The semiconductor device according to claim 1, wherein the interlayer dielectric film is made of silicon nitride.

12. The semiconductor device according to claim 1, further comprising an alignment mark, made of the same material as the wire covering film, formed on the surface of the interlayer dielectric film, wherein the passivation film is provided with an opening exposing the alignment mark.

13. The semiconductor device according to claim 12, further comprising a fuse formed under the interlayer dielectric film.

14. The semiconductor device according to claim 1, further comprising:
a lower wire formed under the interlayer dielectric film; and
a plurality of vias passing through the interlayer dielectric film in a thickness direction for electrically connecting the lower wire and the upper most wire with each other.

15. The semiconductor device according to claim 14, wherein the vias are made of a conductive material not containing copper.

16. The semiconductor device according to claim 14, wherein surfaces of the vias and the surface of the interlayer dielectric film are flush with one another.

17. The semiconductor device according to claim 14, wherein an area proportion of a region provided with the vias with respect to an opposed area of the lower wire and the uppermost wire is not less than 0.5% and not more than 30%.

18. The semiconductor device according to claim 1, further comprising:
a lower wire formed under the interlayer dielectric film; and
a via, made of tungsten, passing through the interlayer dielectric film in a thickness direction for electrically connecting the lower wire and the uppermost wire with each other.

19. The semiconductor device according to claim 1, wherein the uppermost wire has:
a first wire portion extending in a first direction;
a second wire portion extending in a second direction orthogonal to the first direction; and
one or a plurality of connecting wire portions, connecting an end portion of the first wire portion and an end portion of the second wire portion with each other, extending on a first straight line intersecting with the first direction and the second direction respectively, and
a length of a plurality of second straight lines, connecting a junction between the first wire portion and the connecting wire portion and a junction between the second wire portion and the connecting wire portion with each other, in the first direction and the second direction, respectively, are greater than 1 µm and less than or equal to 10 µm.

20. The semiconductor device according to claim 19, wherein a width of the wire is not less than 10 µm.

21. The semiconductor device according to claim 19, wherein the uppermost wire has only one of the connecting wire portion.

22. A semiconductor device comprising:
an interlayer dielectric film;
an uppermost wire, made of a material mainly composed of copper, formed on a surface of the interlayer dielectric film;
a wire covering film, made of a material mainly composed of aluminum, formed on the uppermost wire;
an alignment mark, made of the same material as the wire covering film, formed on the surface of the interlayer dielectric film; and
a passivation film, made of an insulating material, covering the surfaces of the interlayer dielectric film and the wire covering film and provided with an opening exposing the alignment mark;
wherein the wire covering film extends in both a horizontal direction along an upper surface of the uppermost wire and a perpendicular direction along a side surface of the uppermost wire, the wire covering film covering the uppermost wire.

23. The semiconductor device according to claim 22, further comprising a fuse formed under the interlayer dielectric film.

24. The semiconductor device according to claim 22, wherein the wire covering film covers a surface of the uppermost wire.

25. The semiconductor device according to claim 22, further comprising a first barrier film, made of a material having a barrier property against diffusion of copper, interposed between a surface of the uppermost wire and the wire covering film.

26. The semiconductor device according to claim 25, wherein the first barrier film has a barrier property against diffusion of gold.

27. The semiconductor device according to claim 25, wherein the first barrier film is formed by a single film or a multilayer film made of one or more materials selected from a group consisting of Ti, TiN, WN, TaN, Ta, W and TiW.

28. The semiconductor device according to claim 22, wherein a second barrier film having a barrier property against diffusion of copper is interposed between the uppermost wire and the interlayer dielectric film.

29. The semiconductor device according to claim 28, wherein the second barrier film is formed by a single film or a multilayer film made of one or more materials selected from a group consisting of Ti, TiN, WN, TaN, Ta, W and TiW.

30. The semiconductor device according to claim 22, wherein
the passivation film is provided with a pad opening selectively exposing the surface of the wire covering film,
the semiconductor device further comprises a bonding wire, made of copper, bonded to a portion of the wire covering film exposed from the pad opening, and
the wire covering film is in close contact with the uppermost wire.

31. The semiconductor device according to claim 22, wherein the passivation film is made of silicon nitride.

32. The semiconductor device according to claim 22, wherein the passivation film includes a nitride film made of silicon nitride and an organic film, made of an organic material, formed on the nitride film.

33. The semiconductor device according to claim 22, wherein the passivation film is made of an organic material.

34. The semiconductor device according to claim 22, wherein the interlayer dielectric film is made of silicon nitride.

35. The semiconductor device according to claim 22, further comprising:
a lower wire formed under the interlayer dielectric film; and
a plurality of vias passing through the interlayer dielectric film in a thickness direction for electrically connecting the lower wire and the uppermost wire with each other.

36. The semiconductor device according to claim 35, wherein the vias are made of a conductive material not containing copper.

37. The semiconductor device according to claim 35, wherein surfaces of the vias and the surface of the interlayer dielectric film are flush with one another.

38. The semiconductor device according to claim 35, wherein an area proportion of a region provided with the vias with respect to an opposed area of the lower wire and the uppermost wire is not less than 0.5% and not more than 30%.

39. The semiconductor device according to claim 22, further comprising:
a lower wire formed under the interlayer dielectric film; and
a via, made of tungsten, passing through the interlayer dielectric film in a thickness direction for electrically connecting the lower wire and the uppermost wire with each other.

40. The semiconductor device according to claim 22, wherein the uppermost wire has:
a first wire portion extending in a first direction;
a second wire portion extending in a second direction orthogonal to the first direction; and
one or a plurality of connecting wire portions, connecting an end portion of the first wire portion and an end portion of the second wire portion with each other, extending on a first straight line intersecting with the first direction and the second direction respectively, and
a length of a plurality of second straight lines, connecting a junction between the first wire portion and the connecting wire portion and a junction between the second wire portion and the connecting wire portion with each other, in the first direction and the second direction, respectively, are greater than 1 µm and less than or equal to 10 µm.

41. The semiconductor device according to claim 40, wherein a width of the wire is not less than 10 µm.

42. The semiconductor device according to claim 40, wherein the uppermost wire has only one of the connecting wire portion.

43. A semiconductor device comprising:
an interlayer dielectric film;
a wire, made of a material mainly composed of copper, protruding from a surface of the interlayer dielectric film; and
a passivation film, made of an insulating material, covering the surfaces of the interlayer dielectric film and the wire,
wherein the wire has:
a first wire portion extending in a first direction;
a second wire portion extending in a second direction orthogonal to the first direction; and
one or a plurality of connecting wire portions, connecting an end portion of the first wire portion and an end portion of the second wire portion with each other, extending on a first straight line intersecting with the first direction and the second direction respectively, and a length of a plurality of second straight lines, connecting a junction between the first wire portion and the connecting wire portion and a junction between the second wire portion and the connecting wire portion with each other, in the first direction and the second direction, respectively, are greater than 1 μm and less than or equal to 10 μm.

44. The semiconductor device according to claim 43, wherein a width of the wire is not less than 10 μm.

45. The semiconductor device according to claim 43, wherein the wire has only one of the connecting wire portion.

46. The semiconductor device according to claim 43, further comprising a wire covering film, made of a material mainly composed of aluminum, interposed between the wire and the passivation film.

47. The semiconductor device according to claim 46, further comprising a first barrier film, made of a material having a barrier property against diffusion of copper, interposed between the wire and the wire covering film.

48. The semiconductor device according to claim 47, wherein the first barrier film is formed by a single film or a multilayer film made of one or more materials selected from a group consisting of Ti, TiN, WN, TaN, Ta, W and TiW.

49. The semiconductor device according to claim 43, further comprising a second barrier film, made of a material having a barrier property against diffusion of copper, interposed between the wire and the interlayer dielectric film.

50. The semiconductor device according to claim 49, wherein the second barrier film is formed by a single film or a multilayer film made of one or more materials selected from a group consisting of Ti, TiN, WN, TaN, Ta, W and TiW.

\* \* \* \* \*